United States Patent [19]
Koide et al.

[11] Patent Number: 5,670,067
[45] Date of Patent: Sep. 23, 1997

[54] APPARATUS FOR LASER CUTTING WIRING IN ACCORDANCE WITH A MEASURED SIZE OF THE WIRING

[75] Inventors: Masateru Koide; Hiroshi Ikeda, both of Kawasaki, Japan

[73] Assignee: Fujitsu Limited, Kawasaki, Japan

[21] Appl. No.: 238,735

[22] Filed: May 5, 1994

[30] Foreign Application Priority Data

Aug. 4, 1993 [JP] Japan ................. 5-193535

[51] Int. Cl.⁶ ............... B23K 26/02; H05K 3/02
[52] U.S. Cl. ................ 219/121.68; 219/121.83
[58] Field of Search ............ 219/121.6, 121.68, 219/121.69, 121.83, 121.8, 121.82, 121.73, 121.67, 121.76; 216/65

[56] References Cited

U.S. PATENT DOCUMENTS

| | | | |
|---|---|---|---|
| 4,532,401 | 7/1985 | Shiozaki et al. | 219/121.68 |
| 4,675,500 | 6/1987 | Kunz et al. | 219/121.73 |
| 4,764,655 | 8/1988 | Ortiz, Jr. et al. | 219/121.83 |
| 4,769,523 | 9/1988 | Tanimoto et al. | 219/121.82 |
| 4,807,991 | 2/1989 | Carew | 219/121.83 |
| 4,825,034 | 4/1989 | Aavert et al. | |
| 4,918,284 | 4/1990 | Weisz | 219/121.69 |
| 4,918,611 | 4/1990 | Shyu et al. | 219/121.67 |
| 5,099,101 | 3/1992 | Millerick et al. | 219/121.67 |
| 5,168,454 | 12/1992 | LaPlante et al. | 219/121.8 |
| 5,171,963 | 12/1992 | Saruta et al. | 219/121.83 |
| 5,175,504 | 12/1992 | Henley | 219/121.68 |
| 5,208,437 | 5/1993 | Miyauchi et al. | 219/121.67 |
| 5,278,385 | 1/1994 | Gerome et al. | 219/121.68 |
| 5,319,183 | 6/1994 | Hosoya et al. | 219/121.68 |
| 5,597,590 | 1/1997 | Tanimoto et al. | 219/121.68 |

FOREIGN PATENT DOCUMENTS

| | | | |
|---|---|---|---|
| 0 504 850 A1 | 9/1992 | European Pat. Off. | |
| 56-111227 | 9/1981 | Japan . | |
| 2-137682 | 5/1990 | Japan | 219/121.76 |
| 3-487 | 1/1991 | Japan | 219/121.68 |

OTHER PUBLICATIONS

Patent Abstract of JP E-1322, Feb. 19, 1993, vol. 17, No. 85.
Automated Visual Inspection, B.G. Batchelor, D.A. Hill, D.C. Hodgson, IFS, Ltd., UK, 1985 pp. 295–321.
A Pattern Inspection System for High–Density Printed Wiring Boards, Katsumi Fujihara et al., Fujitsu Sci. Tech. J., 31,1, pp. 23–31, Jun. 1994.
Translated Office Action from German Patent Office dated Aug. 17, 1995 citing above listed references.

*Primary Examiner*—Geoffrey S. Evans
*Attorney, Agent, or Firm*—Armstrong, Westerman, Hattori, McLeland & Naughton

[57] ABSTRACT

An apparatus for cutting a wiring on a printed wiring board using a laser beam includes a laser oscillator for emitting a laser beam along a main optical path, a multiaxis positioning apparatus for changing the three-dimensional coordinates of a printed wiring board, an X-Y adjustment apparatus for adjusting two-dimensional coordinates, perpendicular to the main optical path, an apparatus for optically measuring a size of a wiring to be cut, and a control apparatus for controlling beam parameters of the laser beam in accordance with the measured size.

36 Claims, 39 Drawing Sheets

Frequency of "1"

Frequency of "1"

Frequency of "1"

Frequency of "1"

FIG. 26
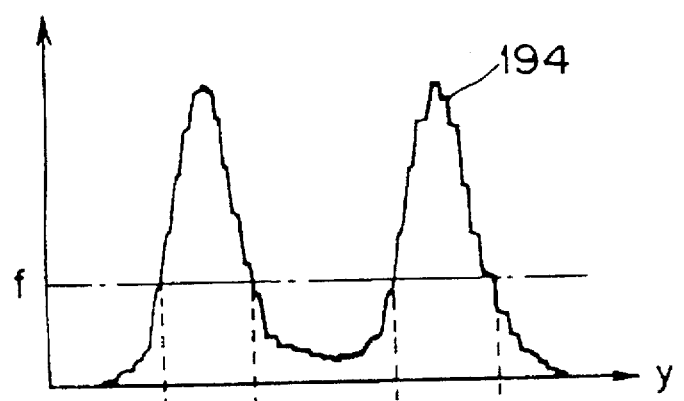
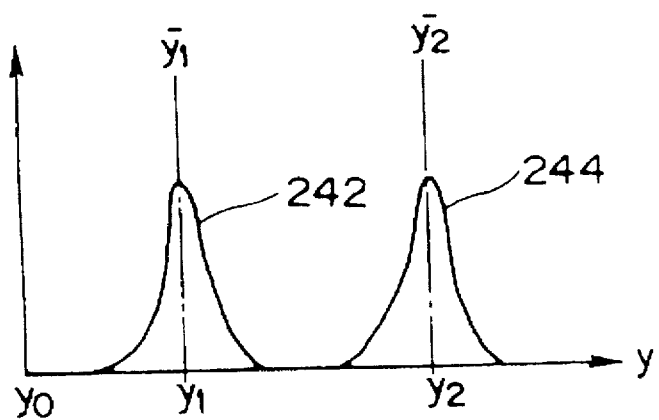

APPARATUS FOR LASER CUTTING WIRING IN ACCORDANCE WITH A MEASURED SIZE OF THE WIRING

BACKGROUND OF THE INVENTION

1. Field of the Invention

The present invention generally relates to an apparatus for cutting wiring for use in changing or repairing a wiring on a printed wiring board and more particularly to an apparatus for cutting wiring suitable for automation.

2. Description of the Related Art

When a wiring on a printed wiring board was changed on account of a change made in design of an electronic circuit or when a breakage of a wiring was produced on a printed wiring board due to troubles in the fabrication process, the printed wiring board was thrown away. On the other hand, with the increase in processing speeds of electronic computers and communication apparatus in recent years, there have been increasing demands for higher density of wirings on the printed wiring board and, accordingly, there have been developments made in miniaturization of wirings and in the arrangement of multilayer thin-film structure, and this has brought about a situation of cost increase in the fabrication of printed wiring boards.

Under such a situation, it is desired that the printed wiring boards be reused by changing the wiring following a change made in design of electronic circuits or repairing the wiring which was broken due to short circuiting or the like. Therefore, it is desired that an apparatus for cutting a wiring for use in changing or repairing a wiring on a printed wiring board be provided.

One of the prior art methods to cut a wiring on a printed wiring board is such that is manually performed with minute tweezers and a knife. The worker, while looking at a wiring as the object of cutting through a microscope, makes a cutting across the wiring so that a predetermined distance separating the conductor is provided.

Another of the prior art methods of cutting a wiring is such that cuts the wiring in a noncontact manner using a laser oscillator. As the laser for use in cutting a metallic wiring generally formed of copper, it is found by experiment that a YAG laser with a wavelength of 1 μm is suitable and there has been developed an apparatus for cutting wiring with a YAG laser mounted thereon.

When the one method of manually cutting a wiring is used, there is a high possibility that an insulating resin layer of polyimide or the like under the wiring is injured and, therefore, there is a problem that it is difficult to achieve the cutting of a wiring maintained at a certain level of quality.

When the other method of cutting a wiring with a laser is used, a good cutting result can be obtained if the condition of irradiation by the laser beam is most suitable. However, it is frequently the case that the conditions of the wiring to be cut (such as thickness and width) are not as accurate as designed. Therefore, there has been a problem that the wiring is not cut well or the insulating resin layer is damaged by excessive irradiation of a laser beam.

To resolve such a problem, a method is practiced in which a worker, while looking at a wiring displayed on a monitor, adjusts, by experience, the current or the like of the power supply to the laser oscillator. Because the quality of cutting in this method is directly dependent on the skill of the worker, automation of the cutting of the wiring is quite difficult a task.

SUMMARY OF THE INVENTION

Accordingly, an object of the present invention is to provide an apparatus for cutting wiring which is suited for automation.

In accordance with an aspect of the present invention, there is provided an apparatus for cutting a wiring, which, in an apparatus to cut a wiring on a printed wiring board with a laser beam, comprises a laser oscillator emitting the laser beam along the main optical path including a convergent optical system, multiaxis positioning means for holding the printed wiring board such that the printed wiring board is oriented virtually orthogonal to the main optical path and also changing three-dimensional coordinates of the printed wiring board, X-Y axis adjustment means for adjusting the two-dimensional coordinates, of the three-dimensional coordinates, perpendicular to the main optical path in accordance with position information supplied from a host computer such that the laser beam is thrown on a wiring to be cut, optical means for optically measuring form parameters of the wiring to be cut, and control means for controlling beam parameters of the laser beam in accordance with the form parameters measured by the optical means such that the wiring to be cut is cut most favorably.

According to the apparatus for cutting a wiring of the present invention, since a printed wiring board is positioned such that a laser beam is thrown on a wiring to be cut and beam parameters of the laser beam are adapted to be controlled according to the optically measured form parameters such that the wiring to be cut is cut most suitably, there are hardly produced variations in the quality of cutting and it becomes possible to provide a wiring cutting apparatus fit for automation.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 26 is a diagram showing a third embodiment for thickness measurement;

DESCRIPTION OF THE PREFERRED EMBODIMENTS

An embodiment of the present invention will be described below in detail with referring to the accompanying drawings.

Figure 1:
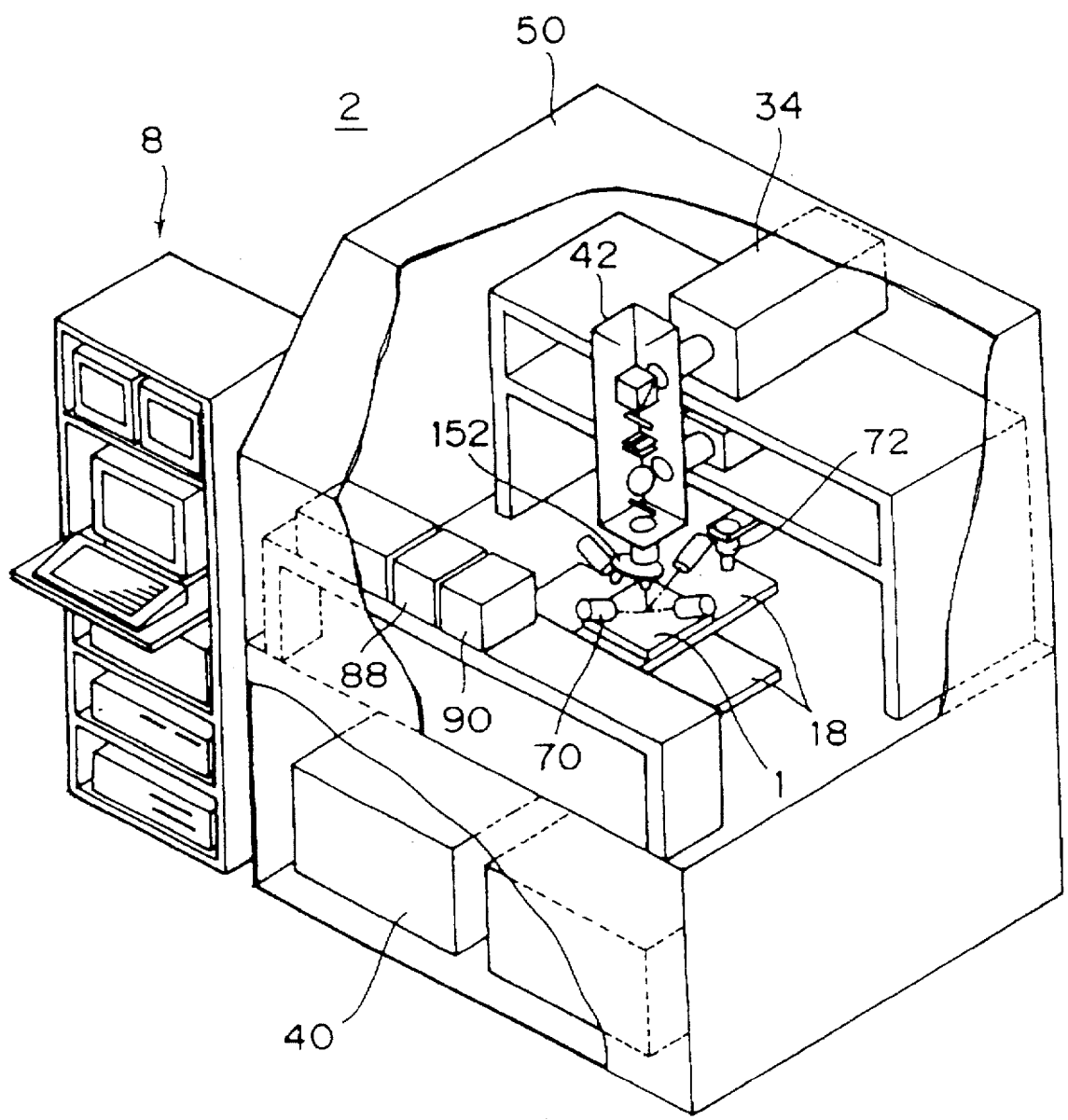
FIG. 1 is a broken-out perspective view of apparatus for cutting wiring.
Figure 2:
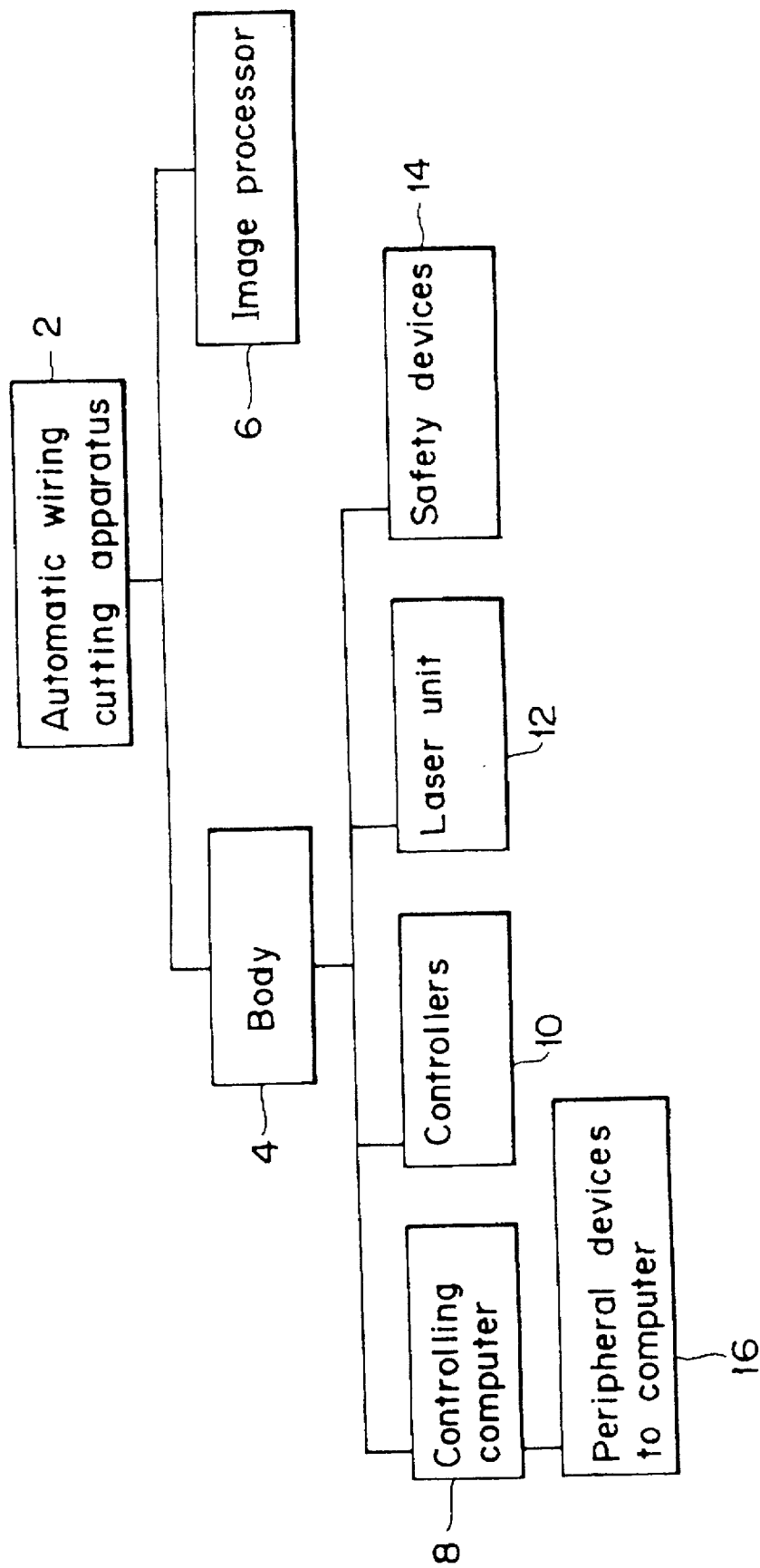
FIG. 2 is a block diagram of the apparatus for cutting wiring.

FIG. 1 is a broken-out perspective view of an automatic wiring cutting apparatus showing an embodiment of the invention, and FIG. 2 is a block diagram of the automatic wiring cutting apparatus.

The automatic wiring cutting apparatus 2 for automatically cutting a printed wiring on a printed wiring board 1 is functionally constituted of a body 4 and an image processor 6. The body 4 comprises a controlling computer 8, various controllers 10, a laser unit 12 for wiring cutting, and safety devices 14. The controlling computer 8 has various peripheral devices 16 to the computer.

Figure 3:
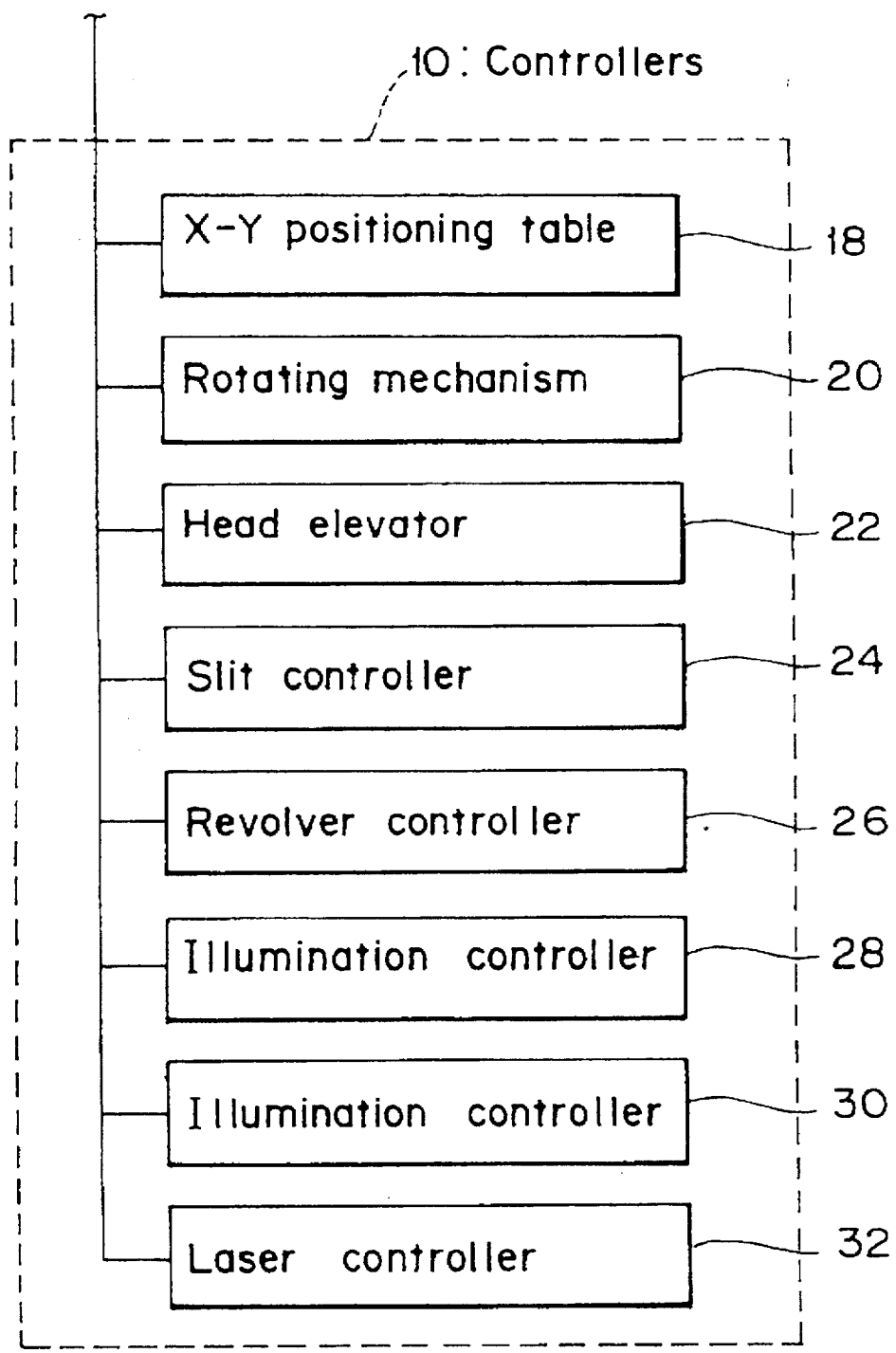
FIG. 3 is a block diagram of the controllers 10 shown in FIG. 2.

The various controllers 10, as shown well in FIG. 3, have an X-Y positioning table 18 for positioning the printed wiring board 1 in the directions of two axes perpendicular to the main optical path of the laser beam, a rotating mechanism 20 for rotating the positioning table, a head elevator 22, a slit controller 24 for changing a portion of beam parameters of the laser beam, a revolver controller 26 for varying the magnification of the objective lens, two illumination controllers 28 and 30, and a laser controller 32.

Figure 4:
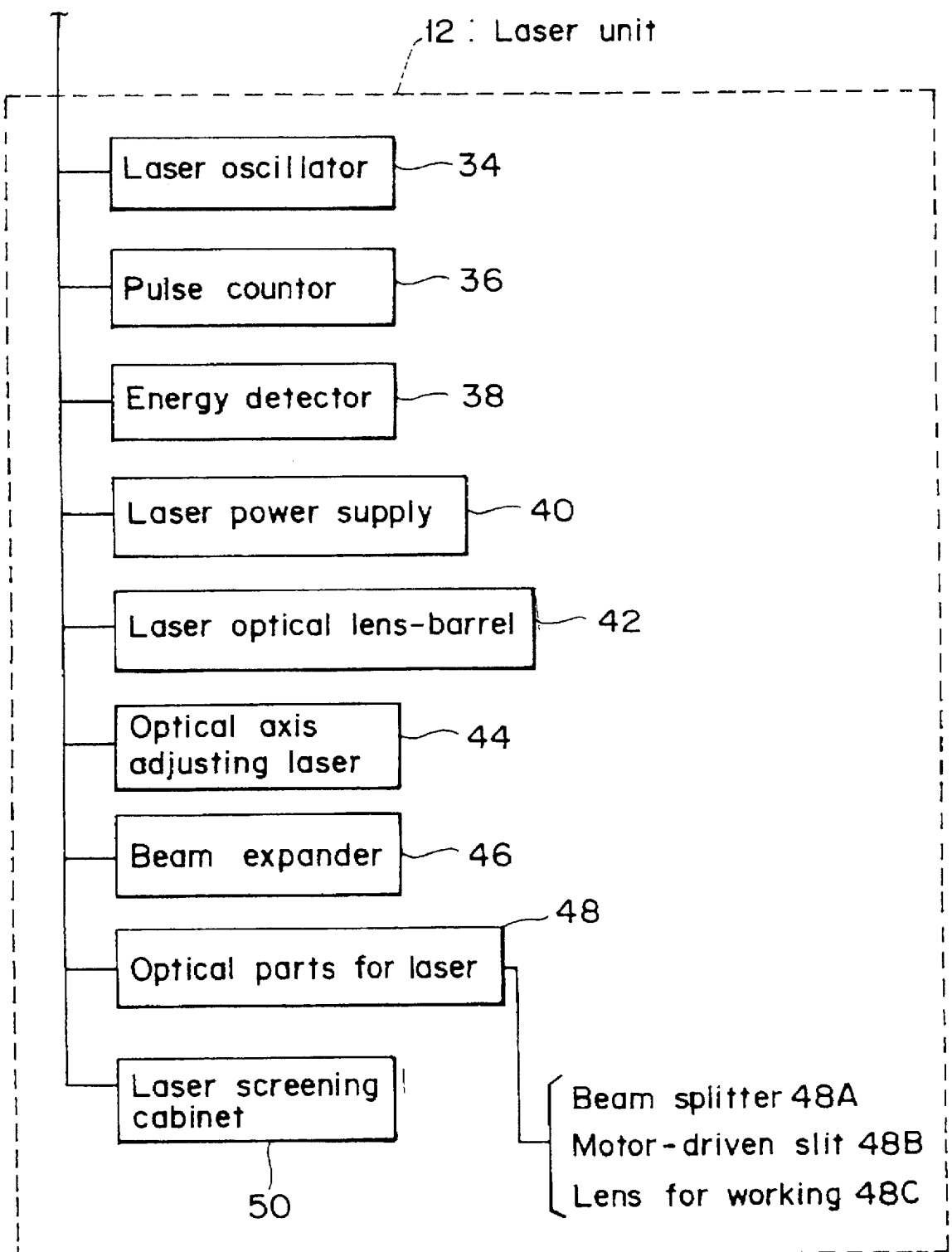
FIG. 4 is a block diagram of the laser unit 12 shown in FIG. 2.

The laser unit 12, as shown well in FIG. 4, has a laser oscillator 34, a pulse counter 36 for counting the number of pulses of the laser beam thrown on a wiring, an energy detector 38 for detecting energy of the laser beam thrown on the wiring, a laser power supply 40, a laser optical lens-barrel 42 for converging a laser beam from the laser oscillator 34 on the wiring on a printed wiring board 1, another laser oscillator 44 for adjusting the optical axis of the laser for wiring cutting, a beam expander 46 having a collimating function, various optical parts 48 for the laser, and a laser screening cabinet 50. In order to effectively melt and evaporate the wiring on a printed wiring board 1, a YAG laser oscillator is preferably selected as the laser oscillator 34. The various optical parts 48 for the laser include a beam splitter 48A, a motor-driven slit 48B, and an objective lens 48C for working.

Figure 5:
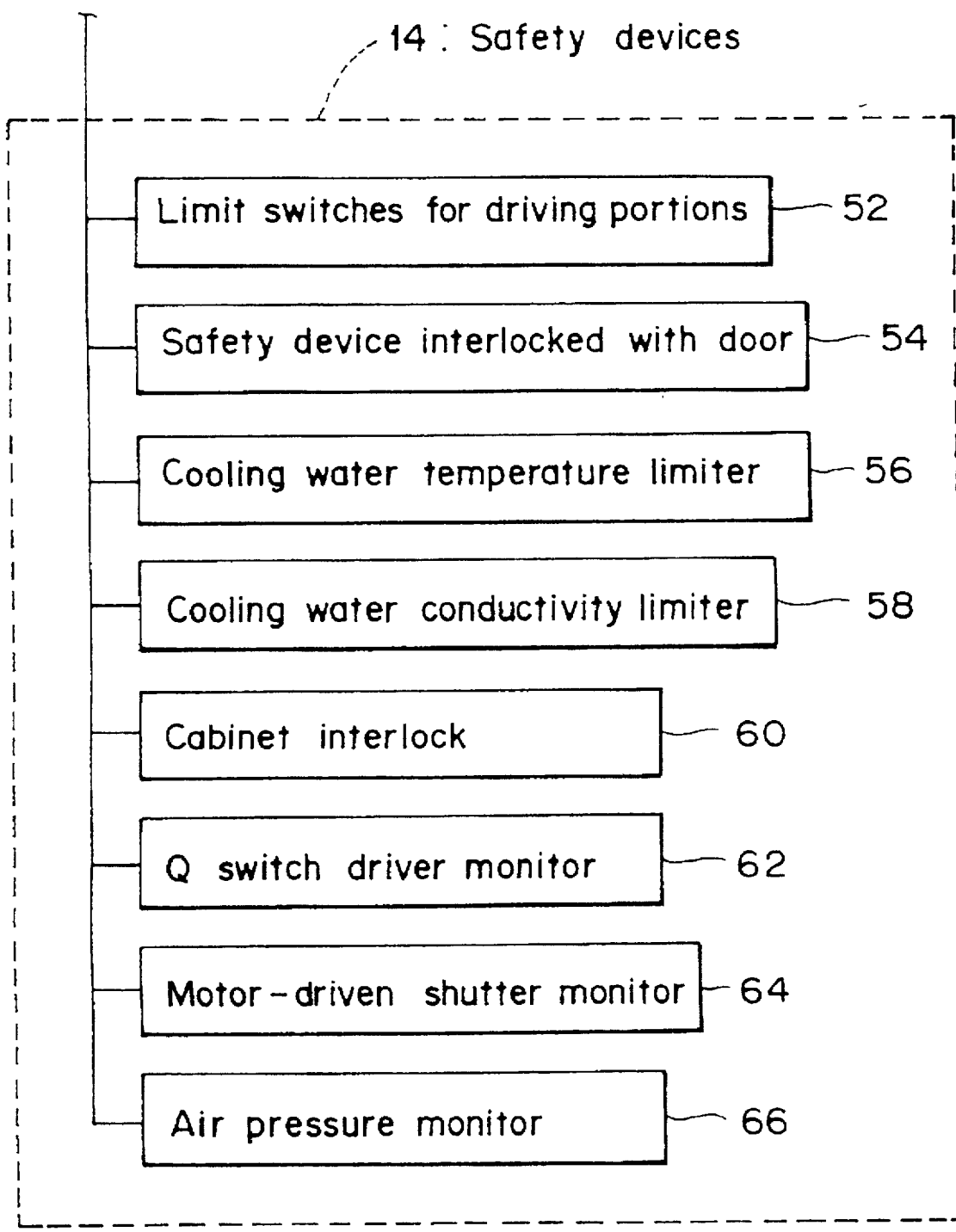
FIG. 5 is a block diagram of the safety devices 14 shown in FIG. 2.

The safety devices 14, as shown well in FIG. 5, include limit switches 52 for various driving portions, a safety device 54 interlocked with a door, a cooling water temperature limiter 56, a cooling water conductivity limiter 58, a cabinet interlock 60, a Q switch driver monitor 62, a motor-driven shutter monitor 64, and an air pressure monitor 66.

Figure 6:
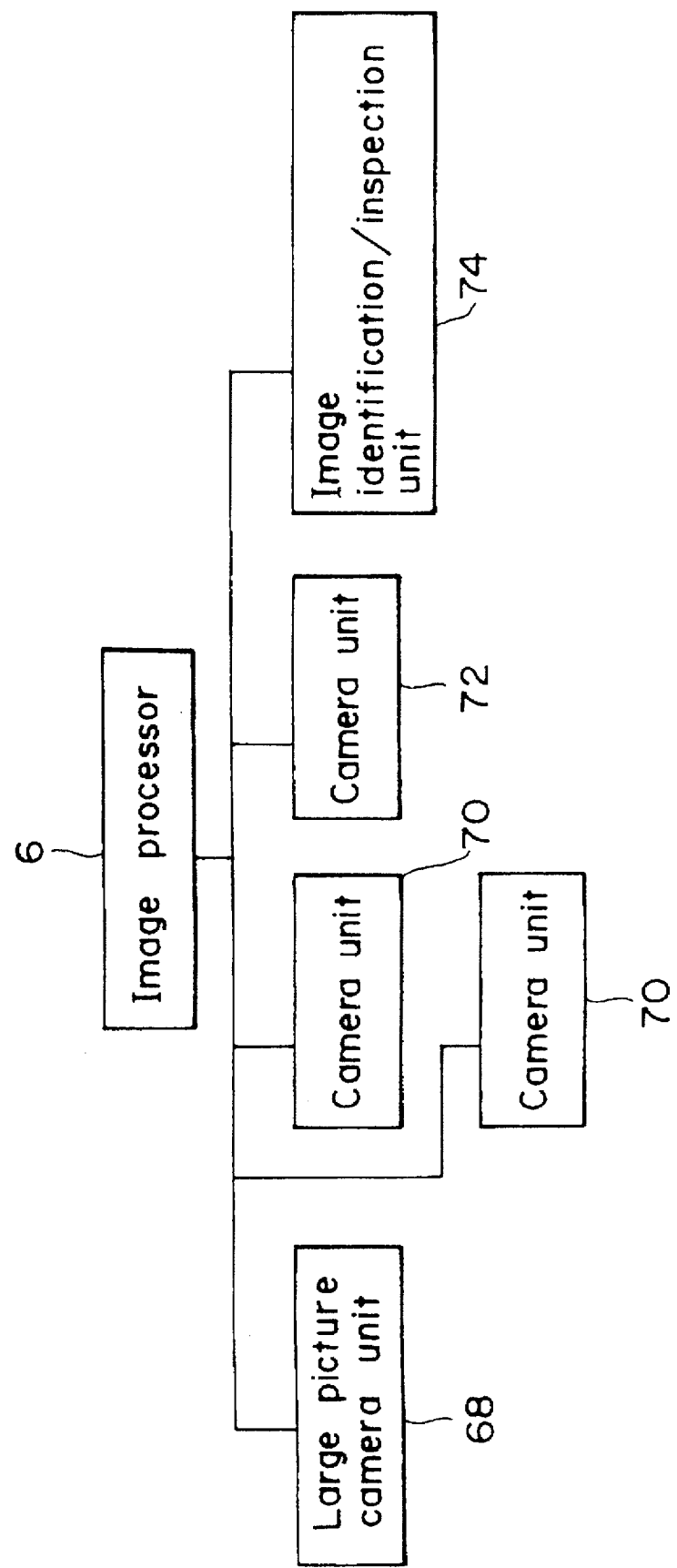
FIG. 6 is a block diagram of the image processor 6 shown in FIG. 2.

The image processor 6, as shown well in FIG. 6, comprises a large picture-plane camera unit 68 for obtaining a two-dimensional image of a wiring on the printed wiring board 1 and the like, two sets of camera units 70 for performing an optical cutting method, a camera unit 72 for identifying a cross mark attached to the printed wiring board 1 in its predetermined position and the like, and an image identification and inspection unit 74.

Figure 7:
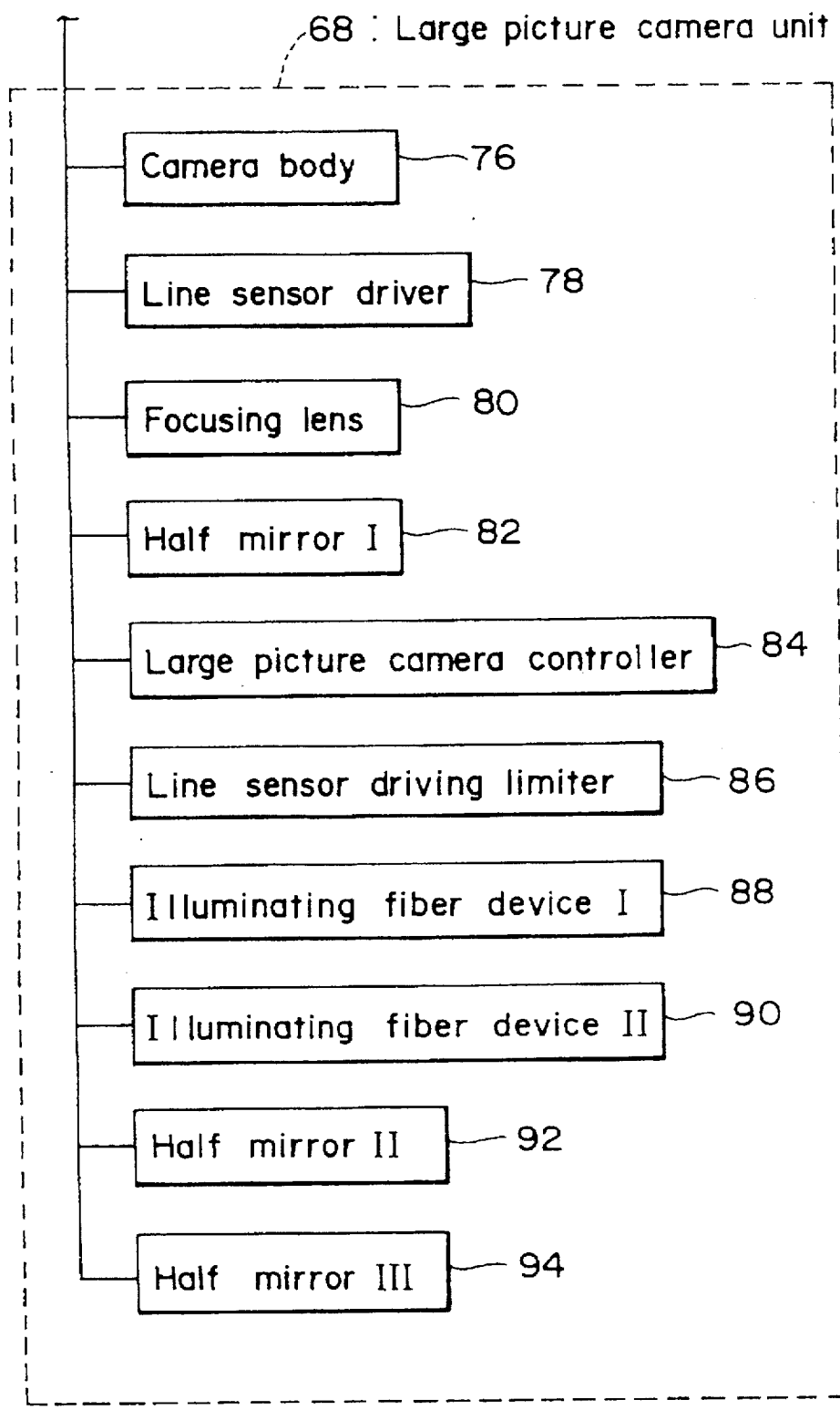
FIG. 7 is a block diagram of the large picture camera unit 68 shown in FIG. 6.

The large picture-plane camera unit 68, as shown well in FIG. 7, has a camera body 76, a line sensor driver 78, a focusing lens 80, a half mirror 82 for branching an optical path to the camera body 76 from the main optical path, a large picture-plane camera controller 84, a line sensor drive limiter 86, an illuminating fiber device 88 for the optical axis adjustment, an illuminating fiber device 90 used for illumination at the time of image pickup, a half mirror 92 for coupling a beam from the illuminating fiber device 88 to the main optical path, and a half mirror 94 for coupling a beam from the illuminating fiber device 90 to the main optical path.

Figure 8:
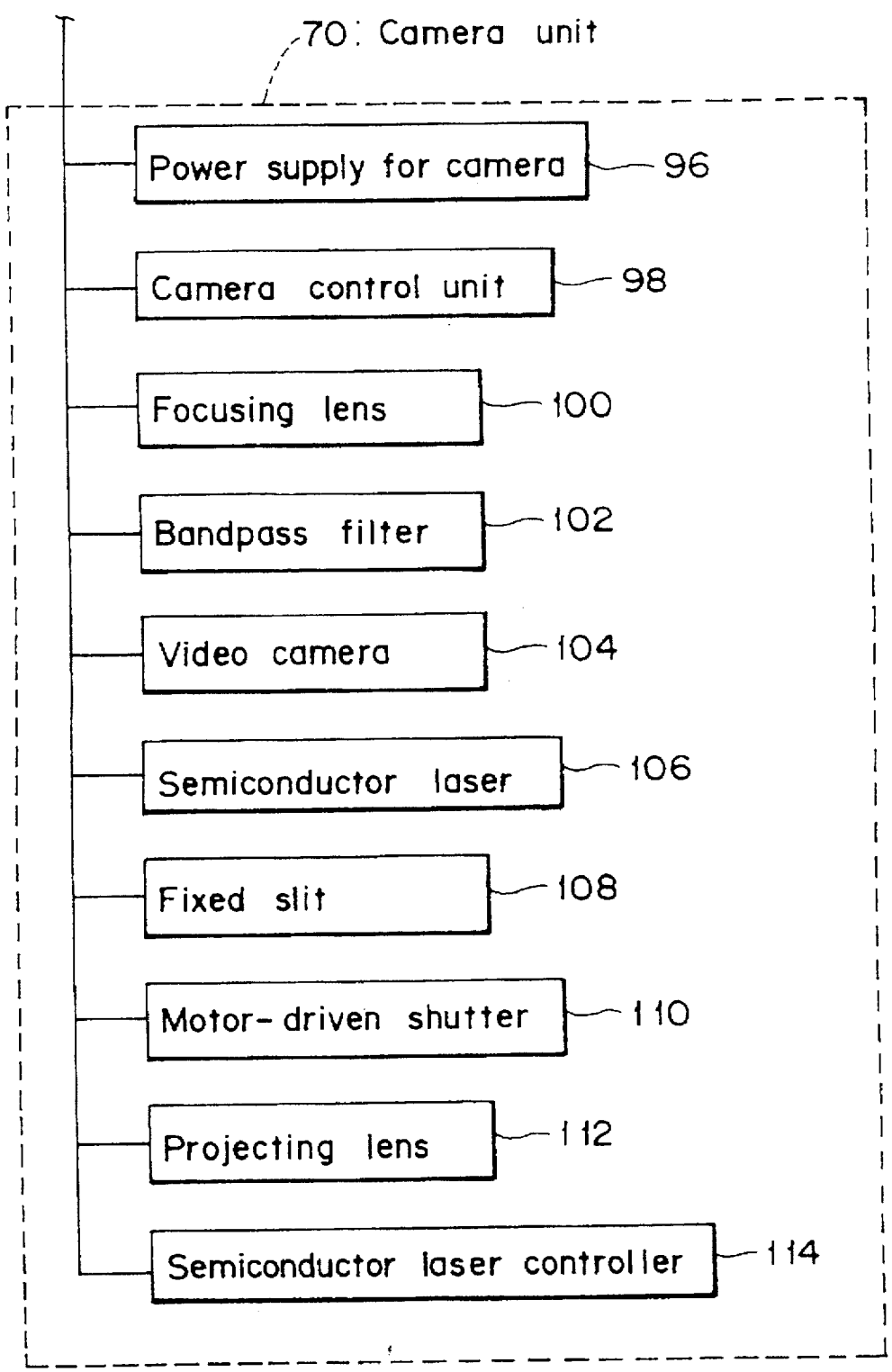
FIG. 8 is a block diagram of the camera unit 70 shown in FIG. 6.

As shown well in FIG. 8, the camera unit 70 for example has a power supply for the camera 96, a camera control unit 98, a focusing lens 100, an optical bandpass filter 102, a television camera 104, a semiconductor laser 106, a fixed slit 108, a motor-driven shutter 110, a projecting lens 112, and a semiconductor laser controller 114.

Figure 9:
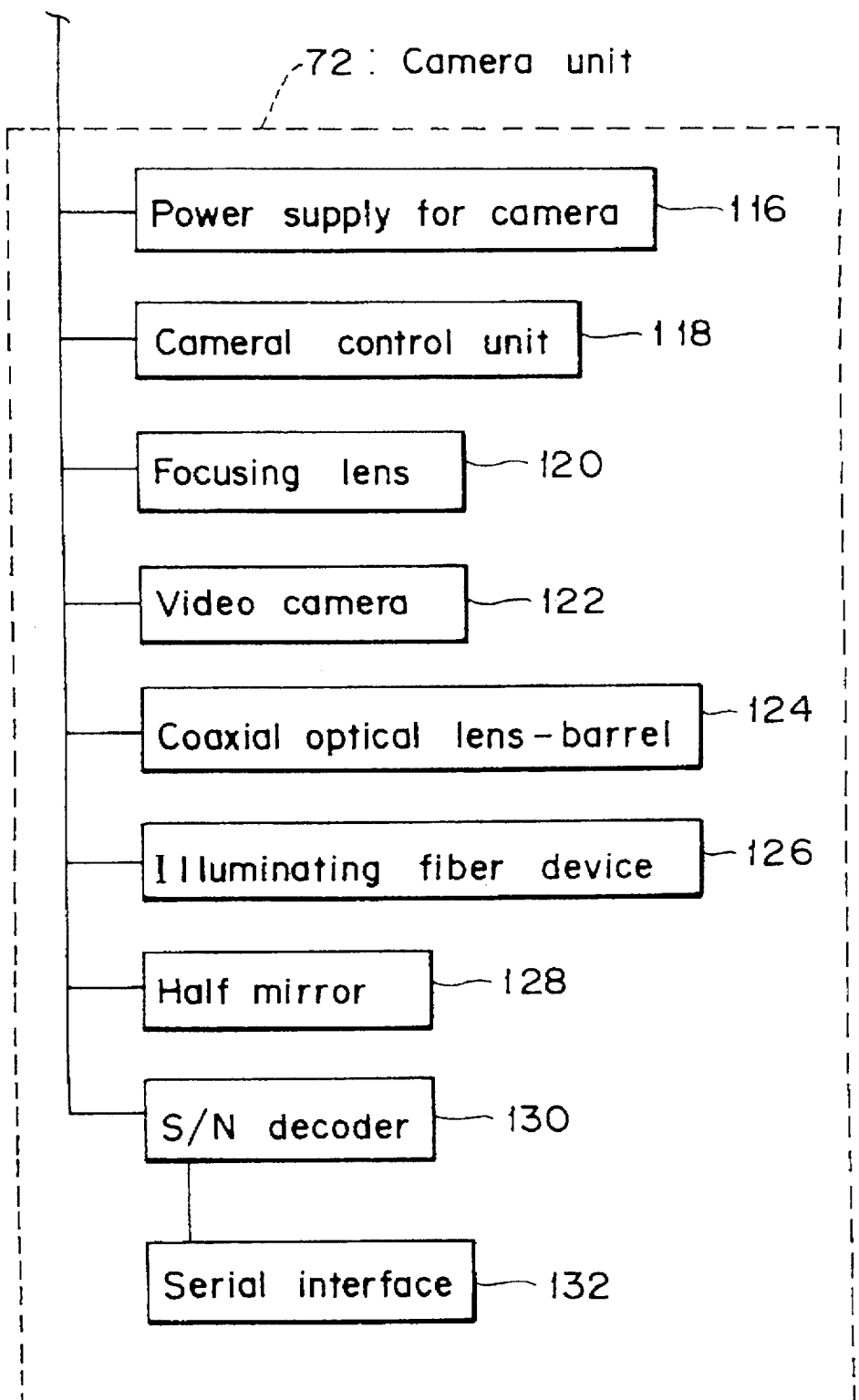
FIG. 9 is a block diagram of the camera unit 72 shown in FIG. 6.
Figure 10:
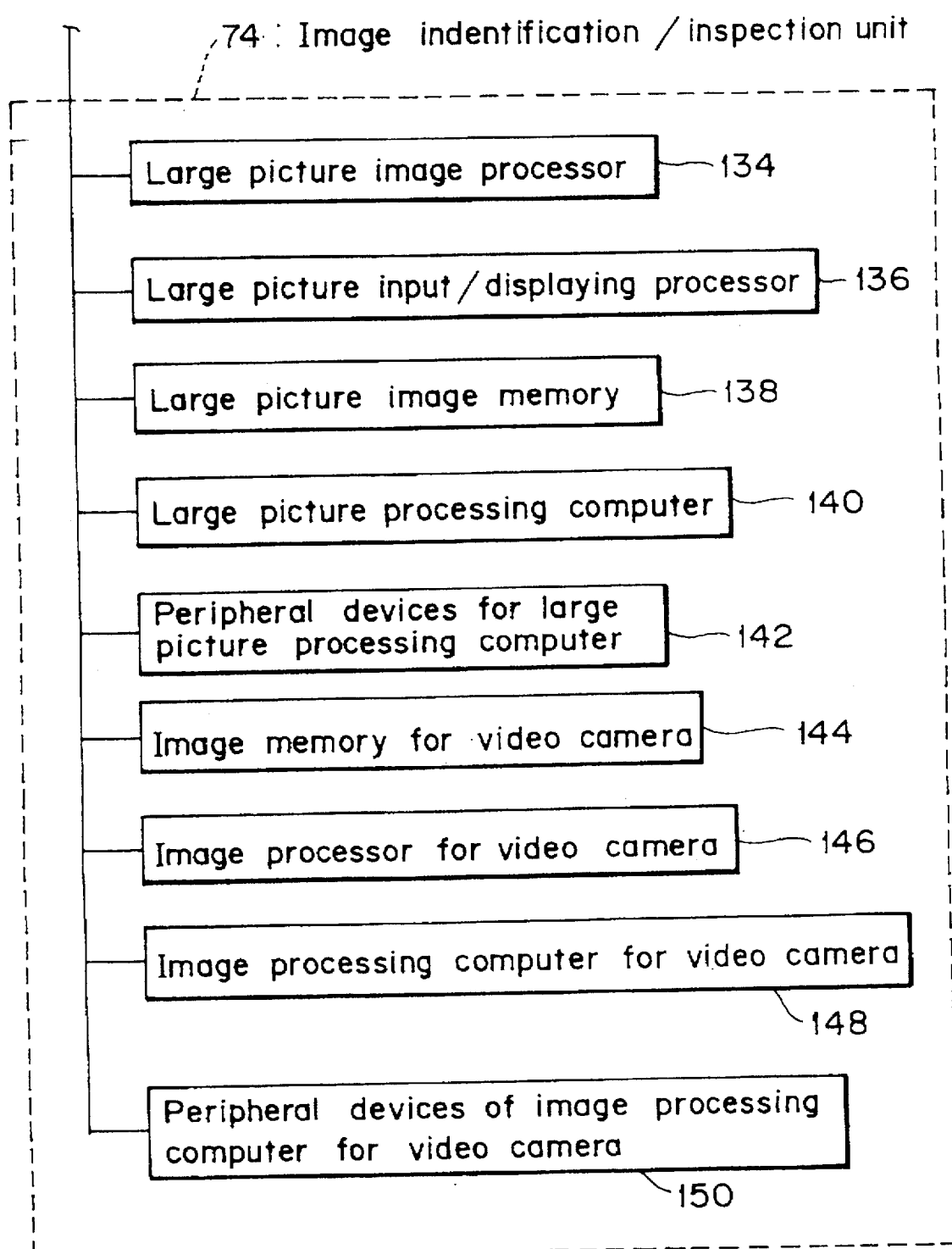
FIG. 10 is a block diagram of the image identification/inspection unit 74 shown in FIG. 6.

The camera unit 72, as shown well in FIG. 9, has a power supply 116 for the camera, a camera control unit 118, a focusing lens 120, a television camera 122, a coaxial optical lens-barrel 124, an illuminating fiber device 126, a half mirror 128, an S/N decoder 130, and a serial interface 132.

As shown well in FIG. 9, the image identification and inspection unit 74 has a large picture-plane image processor 134, a large picture-plane inputting and displaying processor 136, a large picture-plane image memory 138, a large picture-plane processing computer 140, peripheral devices 142 to the large picture-plane processing computer, an image memory 144 for the television camera, an image processor 146 for the television camera, an image processing computer 148 for the television camera, and peripheral devices 150 for image processing computer for the television camera.

Figure 11:
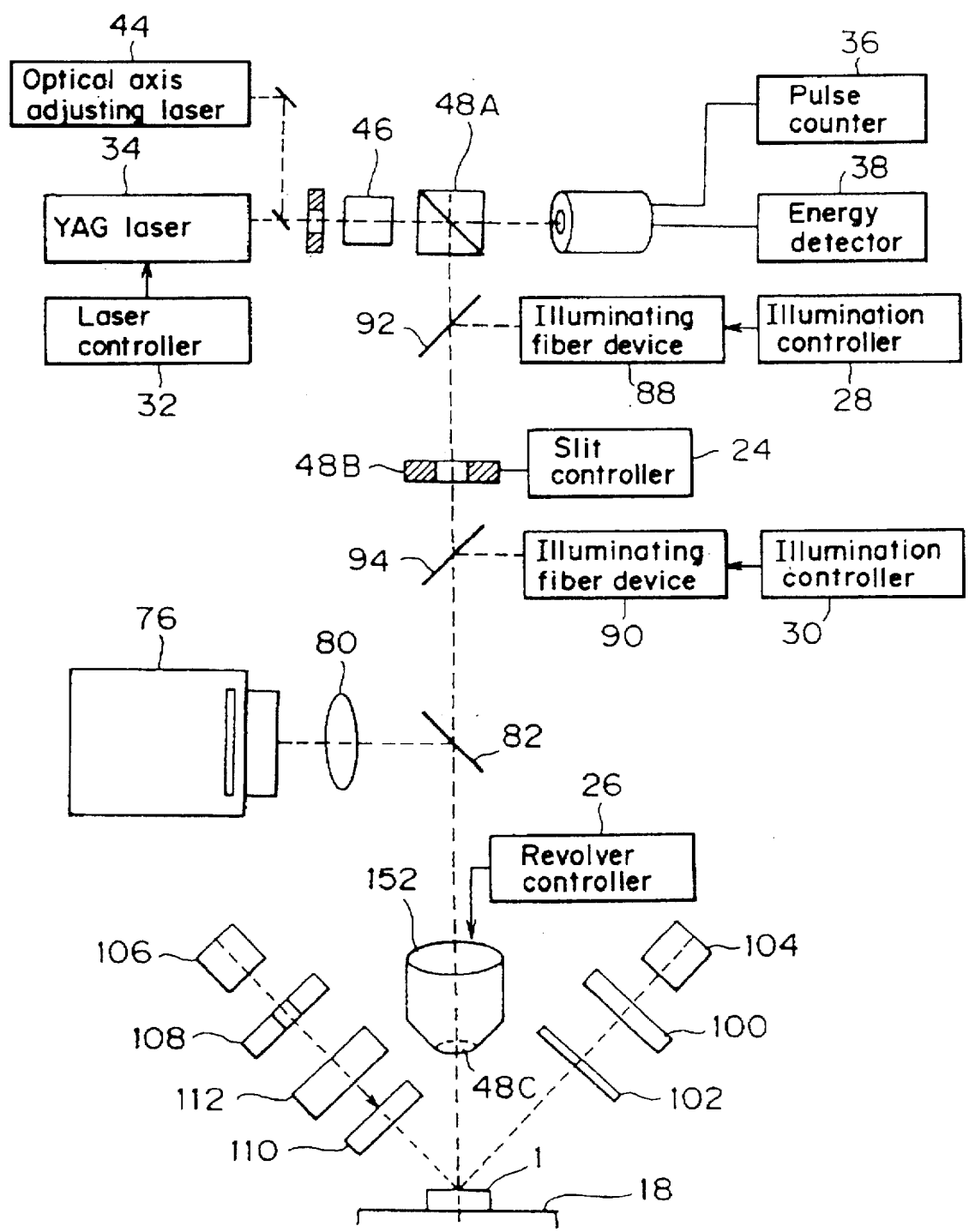
FIG. 11 is a structural diagram of a laser optical lens-barrel.

FIG. 11 shows a structural diagram of an example laser optical lens-barrel 42 shown in FIGS. 1 and 4.

Figure 12A:
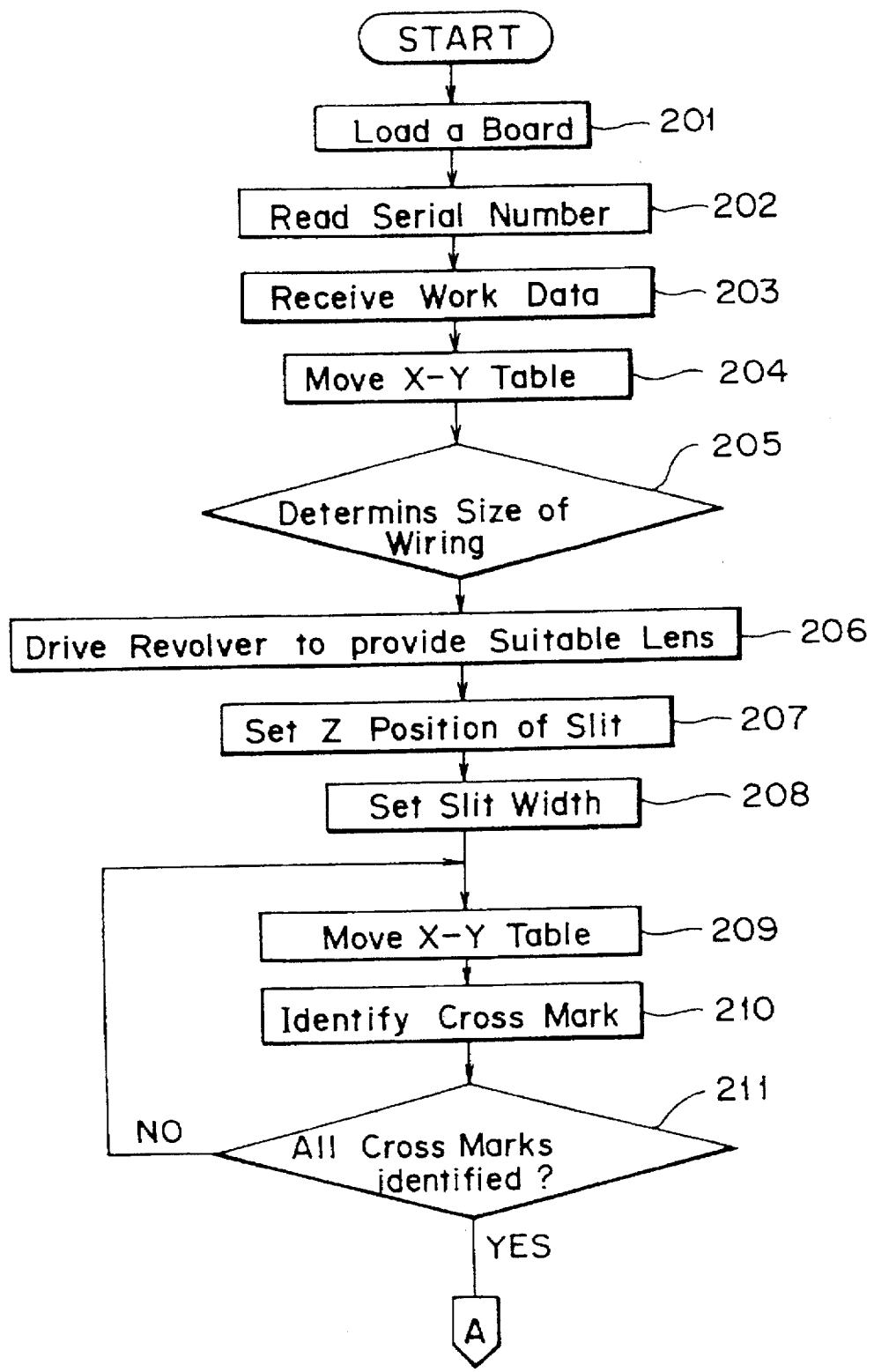
FIGS. 12A, 12B and 12C are flowcharts showing an outline of operations performed in the apparatus for cutting wiring.
Figure 12B:
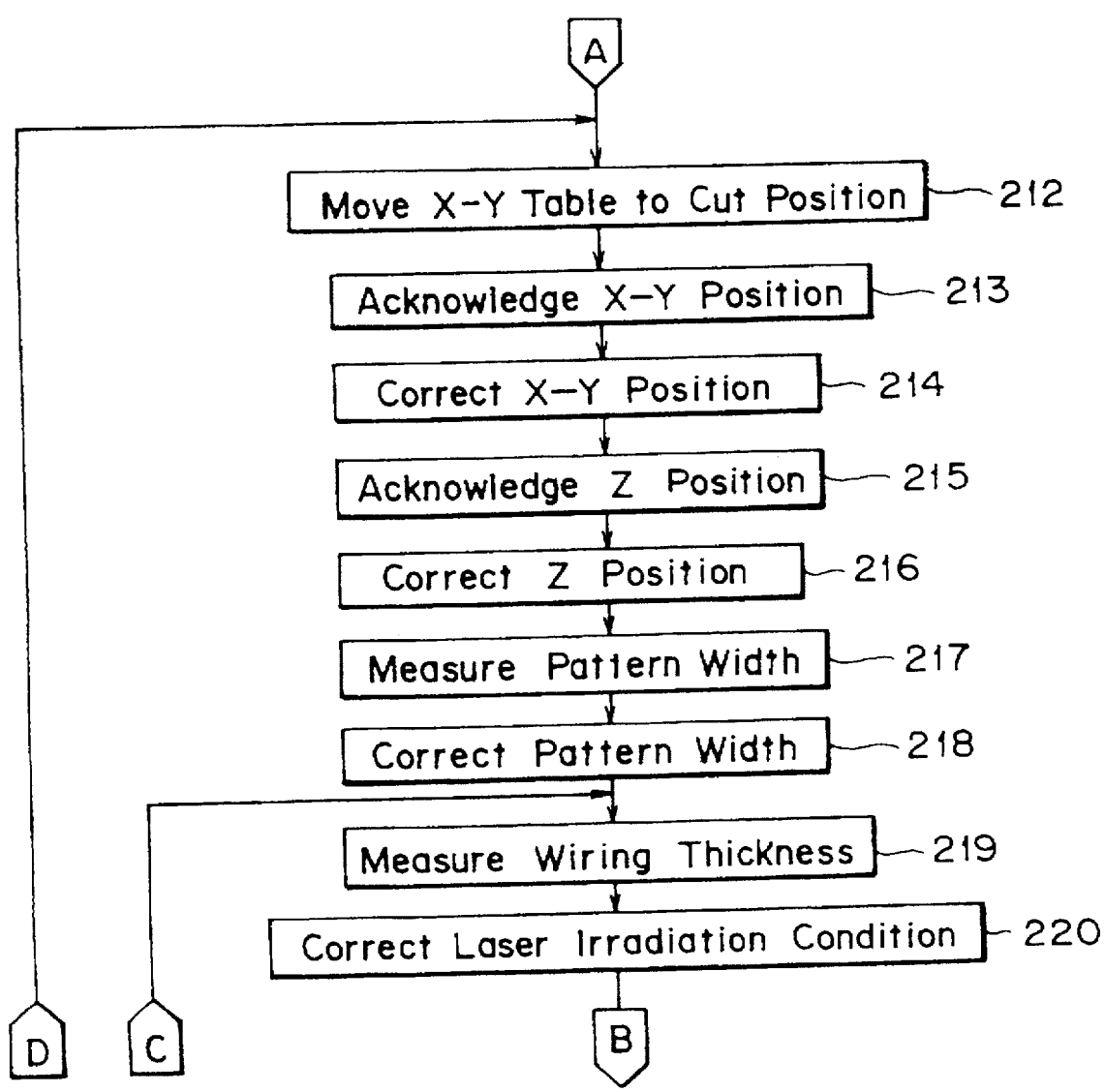
Figure 12C:
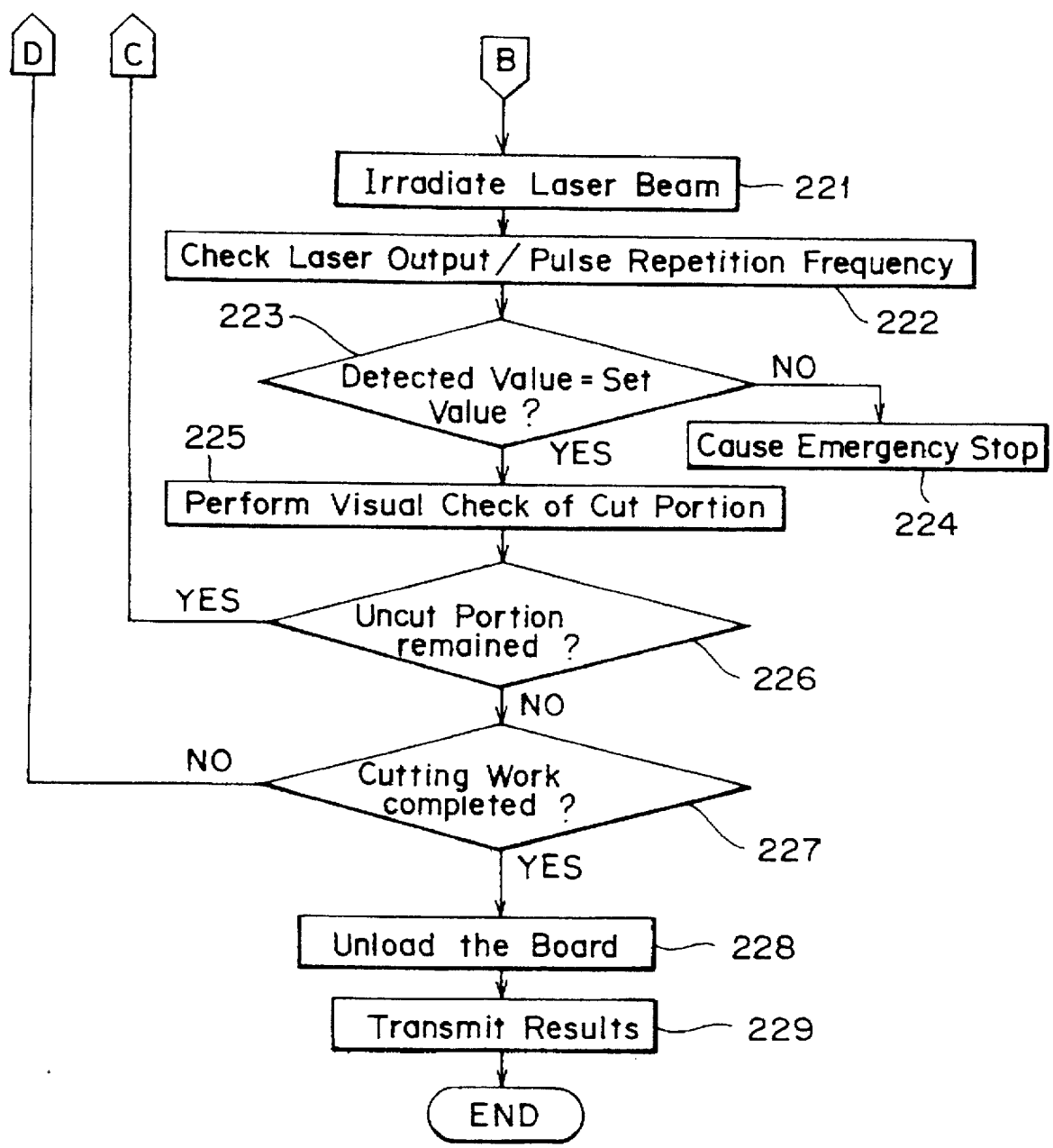

FIGS. 12A, 12B and 12C are flow charts of operations of the wiring cutting apparatus in the present embodiment. First, a production information processing system (host computer) judges whether or not there is a wiring to be cut on a printed wiring board under consideration in accordance with information concerning a change made in the design of the circuit or information concerning breakage of the wiring found out from results of an inspection of the printed wiring board. Depending on the result of the judgment, the printed wiring board 1 having a wiring to be cut is loaded on the X-Y table 18 in step 201. The printed wiring board 1 has a bar code attached thereto indicating its own information. In step 202, the bar code attached to the printed wiring board 1 is read by a bar code reader and, thereby, the serial number of the printed wiring board and whether the obverse of the printed wiring board 1 is turned up or down are known. The serial number is transmitted to the host computer and the wiring cutting apparatus receives from the host computer information about the position and form of the wiring to be cut (step 203).

Then, in step 204, the X-Y table moves so that the wiring to be cut is positioned in the vicinity of the position to be irradiated by a laser beam in accordance with the position information of the wiring to be cut. In step 205, the size (width) of the wiring to be cut determined on the basis of the information about the form of the wiring to be cut received from the host computer. In this example, there is provided a revolver 152 along the main optical path of the laser beam used for wiring cutting (refer to FIG. 11) and this revolver 152 supports thereon a plurality of objective lenses 48C with different magnifications. With the revolver 152 driven by the revolver controller 26, it is adapted such that a laser beam is thrown on the wiring to be cut through a selected objective lens according to the size of the wiring to be cut. In step 206, an objective lens with a suitable magnification is selected according to the size of the wiring to be cut determined in step 205 and the revolver 152 is driven so that the objective lens is positioned in the main optical path. In this embodiment, there is disposed a slit 48B forming a laser beam in the main optical path so that the laser beam matches the form of the wiring to be cut in accordance with the magnification of the objective lens. In step 207, the Z coordinate of the slit 48B is set to be correspondent to the magnification of the objective lens. Then, in step 208, the width of the slit is determined so that the beam width of the laser beam matches the design value of the wiring to be cut which is calculated according to the work data obtained in step 203.

Then, in step 209, to identify the cross marks previously attached to the printed wiring board 1 at its four corners, the X-Y table is first driven so that any of the cross marks is brought to the image pickup position of the camera unit 72. In step 210, the positional error between the position of the identified cross mark and a predetermined position is calculated. In step 211, it is judged whether or not the operations in steps 209 and 210 are completed for all the cross marks. When it is not completed, the processing is returned to step 209, whereas when it is completed, the processing is advanced to step 212.

Then, in step 212, the position of the wiring to be cut previously informed of by the host computer is corrected according to the positional error of the cross mark and, then, the X-Y table is moved to the corrected position. In step 213, the accurate position of the wiring to be cut is acknowledged by means of the large picture-plane camera unit 68 and, in step 214, the position of the wiring to be cut is further corrected. Then, in step 215, the Z coordinate of the wiring to be cut along the main optical path is acknowledged according to a later described method and the Z coordinate is corrected in step 216.

In step 217, the width of the wiring to be cut is measured according to a method also to be described later and, in step 218, the slit width is corrected so as to match the value measured. Then, in step 219, the thickness of the wiring to be cut is measured according to a method also to be described later. In step 220, the irradiation condition of the laser beam is corrected according to the thickness of the wiring measured.

In step 221, the laser beam is thrown on the wiring to be cut under the corrected condition. Then, in step 222, the output level of the laser beam and the pulse repetition frequency of the laser are checked by means of the pulse counter 36 and the energy detector 38 and, in step 223, it is determined whether or not the output level and the pulse repetition frequency of the laser are in agreement with the set values. When they are not in agreement with the set values, an emergency stop is caused in step 224. On the other hand, when they are in agreement with the set values, in the following step 225, a visual check of the cut portion of the wiring is performed by means of the large picture-plane camera unit 76.

Then, in step 226, it is determined whether or not there is residual metal of the wiring at the cut portion and, when there is residual metal, the processing is returned to step 219 and the operations in steps 219 to 225 are repeated. When there is no residual metal, the processing is advanced to step 227, in which it is determined whether or not the cutting work is completed for all the wirings to be cut, and when it is not completed yet, the processing is returned to step 212. If it is completed, the processing is forwarded to step 228, in which the printed wiring board 1 is unloaded from the wiring cutting apparatus and the results of the cutting is transmitted to the host computer in step 229.

The reason why the Z coordinate of the wiring to be cut is acknowledged in step 215 and the Z coordinate is corrected in step 216 is as follows. That is, when the printed wiring board 1 is relatively large, sometimes a warp is produced in the printed wiring board 1 on account of a problem in the fabrication technique. Therefore, by measuring the Z coordinate of the wiring to be cut by an optical cutting method and moving the objective lens along the Z axis, the focal position of the laser beam is correctly positioned on the wiring to be cut. The reason why the width of the wiring to be cut is measured in step 217 and the width of the slit 48B is corrected in step 218 is because there sometimes arises a deviation in the width of the wiring on account of a problem in the fabrication technique.

While the wiring on the printed wiring board is generally formed by soldering, it is difficult to form the wiring precisely constant in thickness when soldering is adopted. It is known that the thickness of the wiring sometimes varies a high percentage of several tens. When wirings with such varying thicknesses are cut with a laser beam under a constant output condition, if the irradiation energy of the laser beam is relatively low, the trouble may only be that there remains metal of the wiring. However, if the irradiation energy of the laser beam is relatively high, an insulating layer (for example, polyimide) would be damaged and thus there would be a risk of the insulation of the printed wiring board becoming deteriorated. Therefore, in the present embodiment, the thickness of the wiring is actually measured by the method of optical cutting in step 219 and the irradiating condition of the laser beam is adjusted in step 220. The setting of the irradiating condition of the laser beam is achieved by setting the current value in the current supply to the laser oscillator 34, the laser oscillation mode in the laser oscillator 34, the laser pulse width (pulse duration) in the laser oscillator 34, or the number of times of irradiation of the laser beam.

Figure 13:
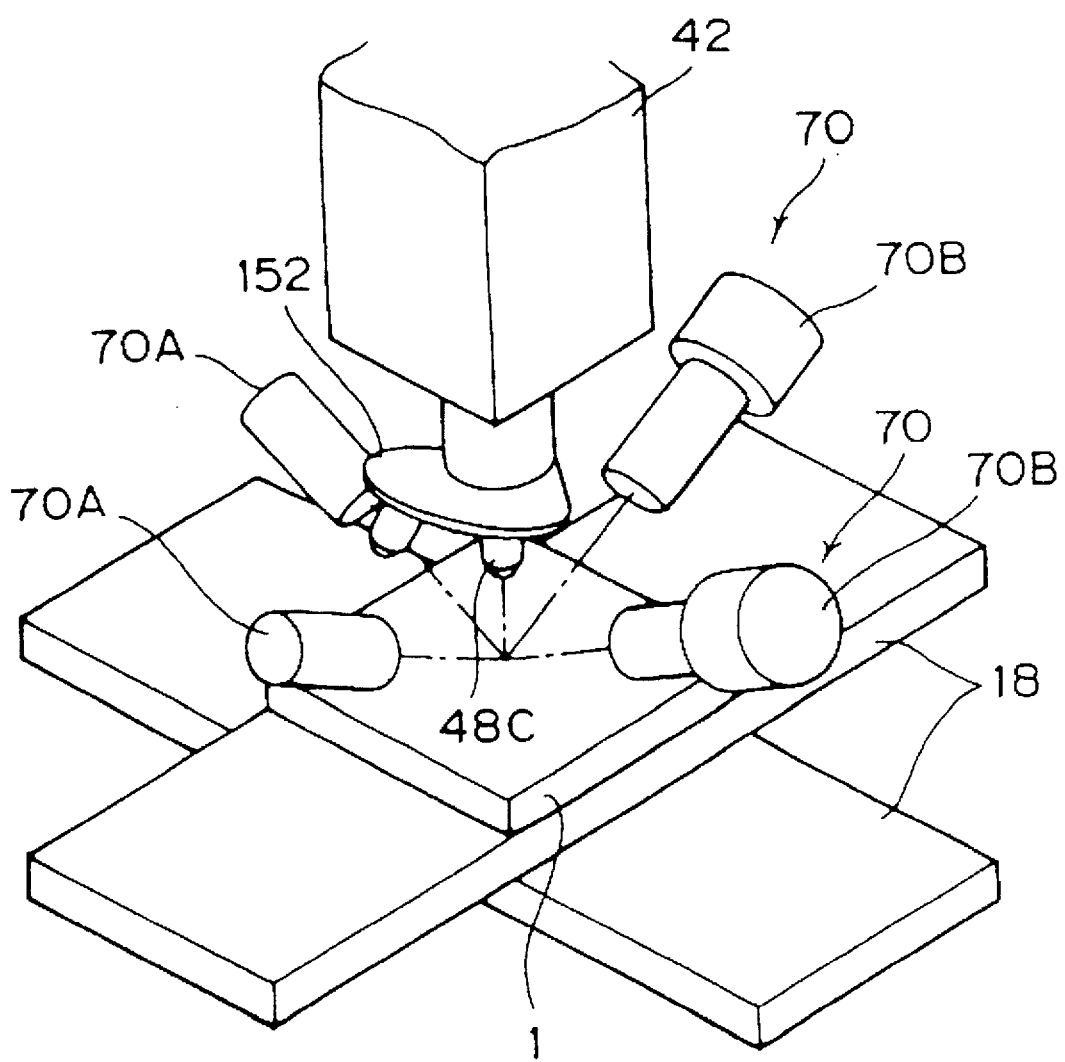
FIG. 13 is a schematic perspective view of a camera unit for optical cutting.

FIG. 13 is a schematic perspective view of a camera unit (optical means) for optical cutting. The camera unit 70 includes a beam projecting portion 70A outputting a slender strip-formed probe beam so that a wiring to be cut of the printed wiring board 1 is subjected to optical cutting along its length and an image pickup portion 70B for picking up the image of the probe beam thrown on the wiring to be cut from a different angle from the angle of beam projection by the beam projecting portion 70A. In this embodiment, considering both cases where the wiring to be cut is stretched in the X direction and stretched in the Y direction, there are provided two sets of the beam projecting portion 70A and image pickup portion 70B arranged perpendicular to each other.

Figure 14:
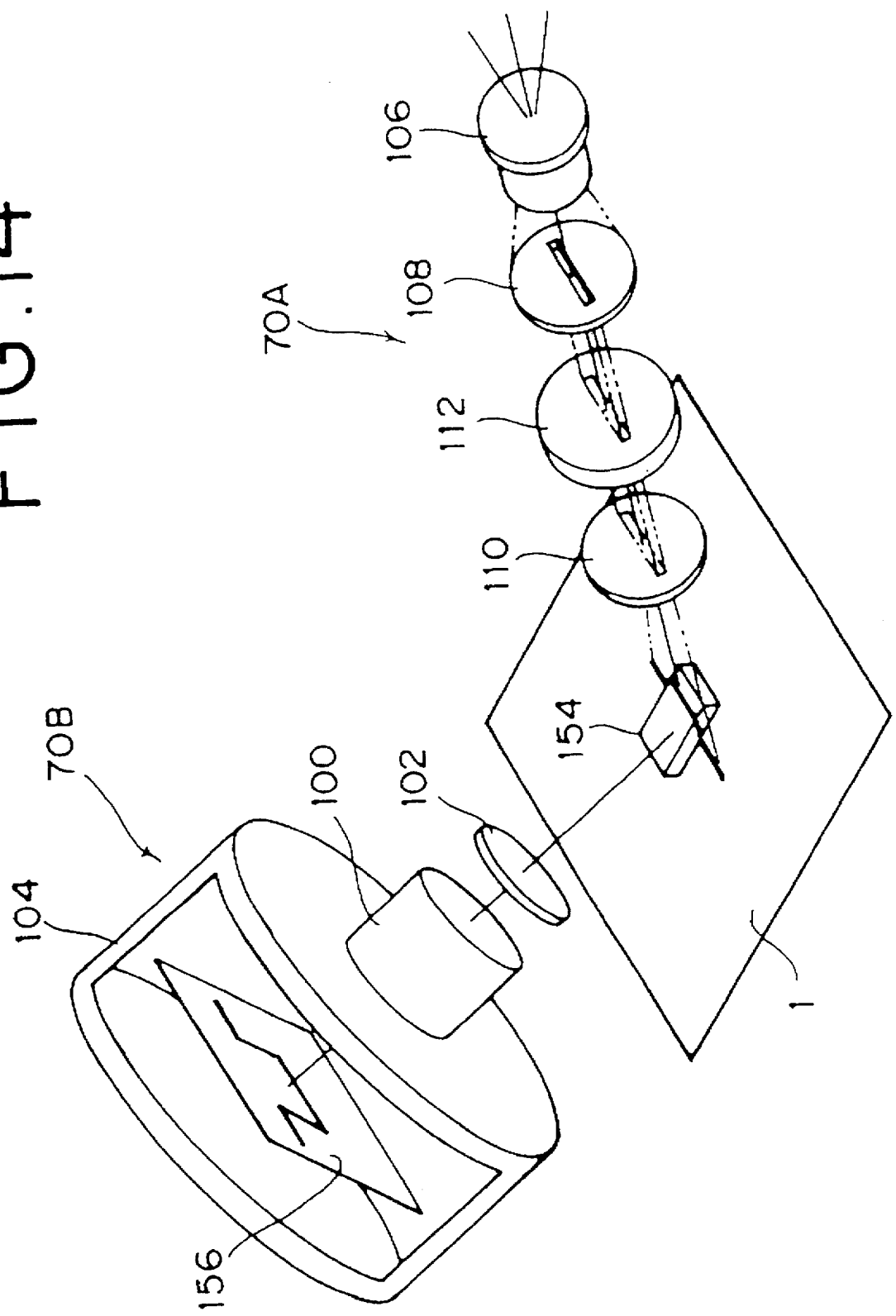
FIG. 14 is a first embodiment of the camera unit for optical cutting.

FIG. 14 is a perspective view showing a first embodiment of the camera unit for optical cutting. In this example, the beam projecting portion 70A comprises a laser beam source (semiconductor laser) 106, a fixed slit 108 allowing the beam emitted from the laser beam source 106 to pass therethrough, a projecting lens 112 allowing the beam passed through the fixed slit to pass therethrough, and a beam shutter (motor-driven shutter) 110 allowing the beam passed through the projecting lens 112 to pass therethrough only a predetermined period of time. The image pickup portion 70B comprises an optical bandpass filter 102 with a passband including the wavelength of the probe beam disposed in confrontation with the wiring 154 to be cut on the printed wiring board 1 and, a television camera 104 for picking up an irradiated image by the probe beam through the filter 102, and a focusing lens 100 for forming an image of the probe beam on the image pickup plane of the television camera 104. According to the present embodiment, since it is therein adapted such that a slender strip-formed probe beam is generated with a fixed slit 108 used and the image of the wiring 154 to be cut irradiated by the probe beam is picked up, it is possible to obtain image information corresponding to the thickness, width, and the like of the wiring 154 to be cut. The method for processing the obtained image information will be described later.

Figure 15:
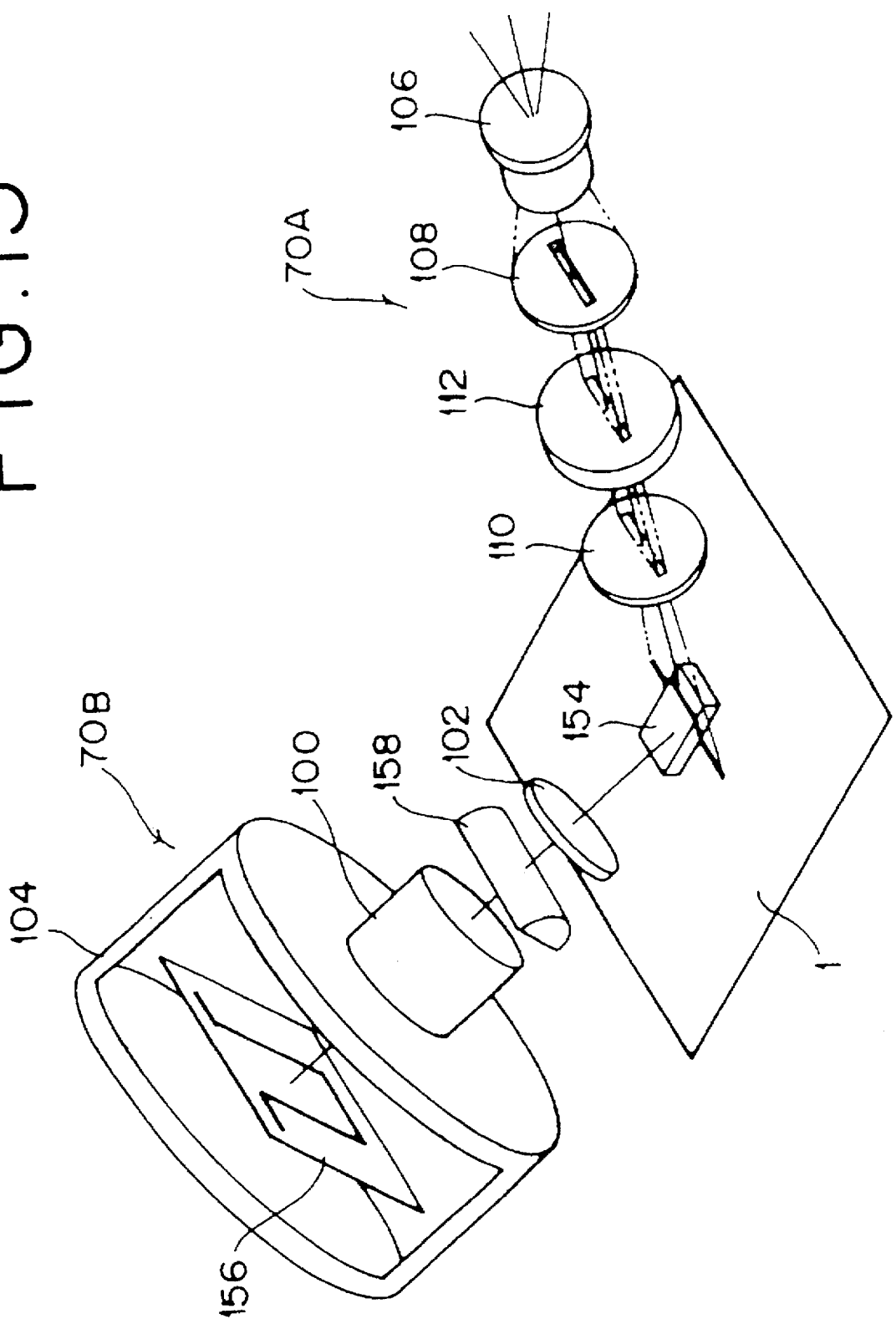
FIG. 15 is a second embodiment of the camera unit for optical cutting.

FIG. 15 is a perspective view showing a second embodiment of a camera unit for optical cutting. This embodiment is characterized by that the image pickup portion 70B is additionally provided with a cylindrical lens 158, as compared with the first embodiment of FIG. 14. The cylindrical lens 158 is disposed between the optical bandpass filter 102 and the focusing lens 100 so that the component in the direction of the thickness of the wiring 154 to be cut of the image focused on the image pickup plane 156 of the television camera 104 is expanded.

Figure 16:
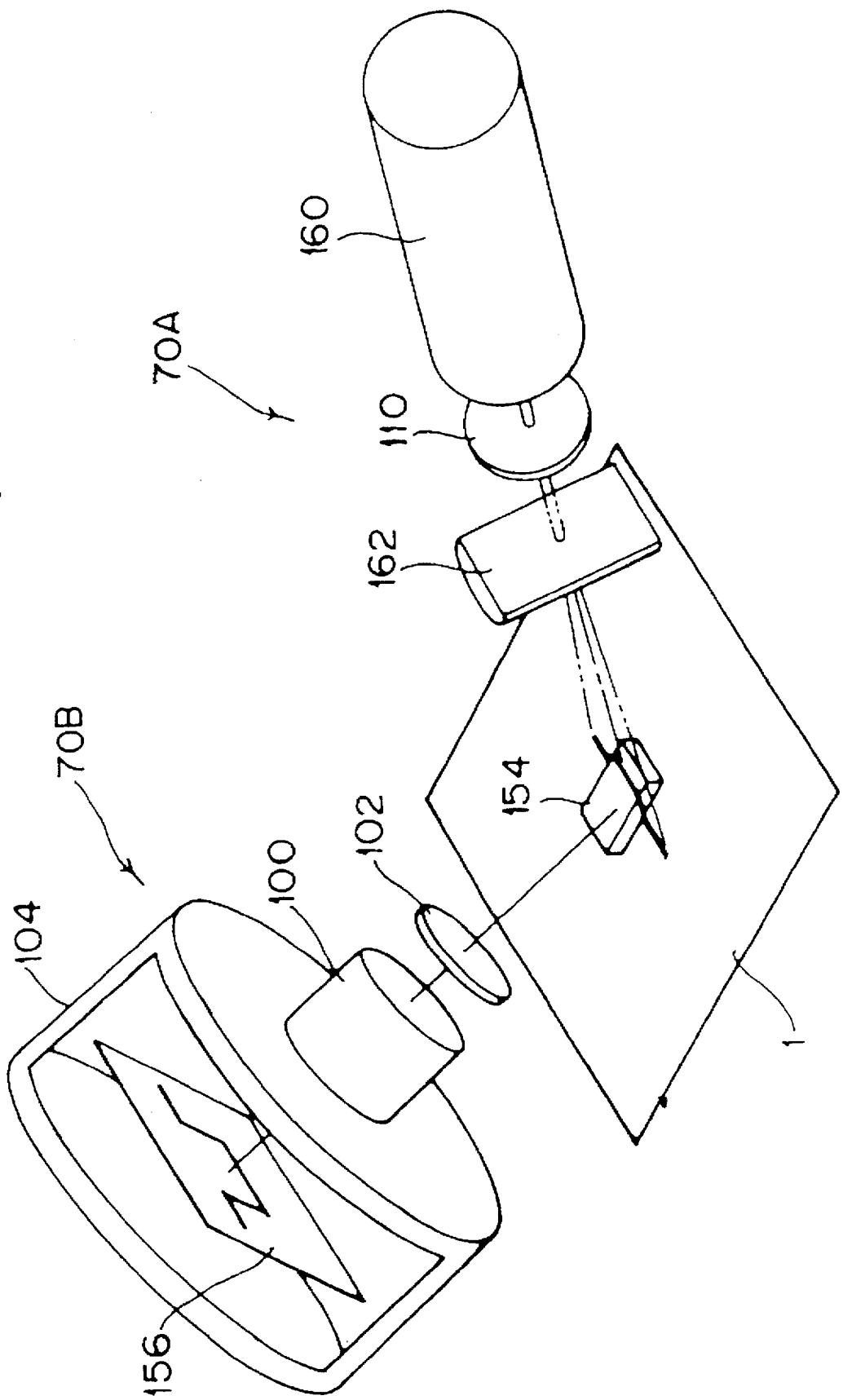
FIG. 16 is a third embodiment of the camera unit for optical cutting.

FIG. 16 is a perspective view showing a third embodiment of a camera unit for optical cutting. In this example, the beam projecting portion 70A comprises a laser beam source 160 outputting the probe beam, a beam shutter 110 allowing the beam radiated from the laser beam source 160 to pass therethrough only for a predetermined period of time, and a cylindrical lens 162 allowing the beam passed through the optical shutter 110 to pass therethrough. The cylindrical lens 162 is arranged so that the beam passing therethrough is expanded in the direction of the width of the wiring 154 to be cut. The image pickup portion 70B is arranged the same as in the first embodiment of FIG. 14. According to the present embodiment, since a slender strip-formed probe beam can be obtained by the use of the cylindrical lens 162, image information about the wiring 154 to be cut can be obtained like in the first embodiment of FIG. 14.

Figure 17:
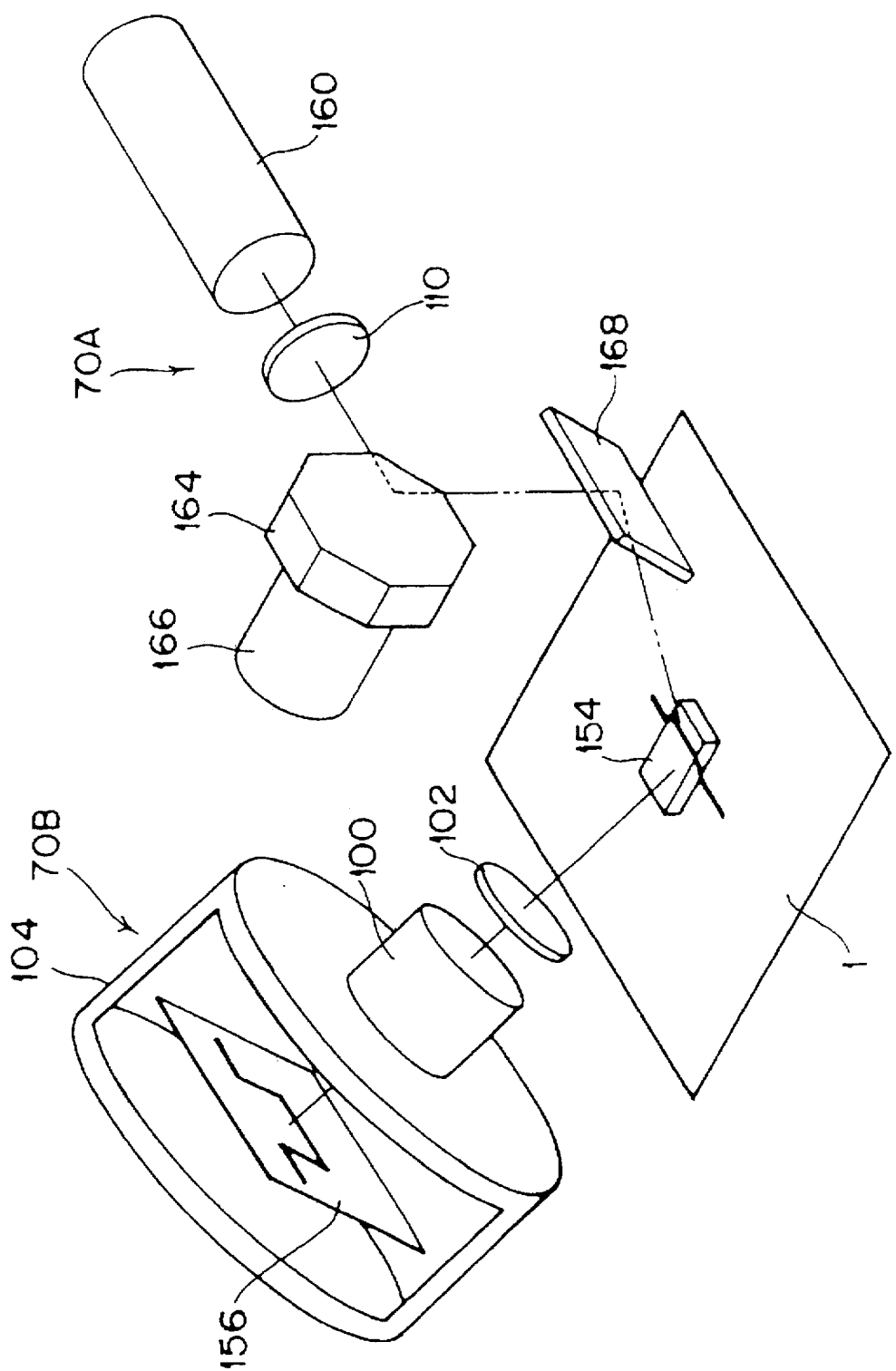
FIG. 17 is a fourth embodiment of the camera unit for optical cutting.

FIG. 17 is a perspective view showing a fourth embodiment of a camera unit for optical cutting. This embodiment and the next fifth embodiment are characterized by a scanning means provided therein for scanning the progressing direction of the beam passed through the optical shutter 110 to thereby obtain a slender strip-formed probe beam. In the present embodiment, the scanning means includes a polygon mirror 164 for reflecting the beam passed through the optical shutter 110, a drive unit 166 for rotating the polygon mirror 164, and a total reflection mirror 168 for further reflecting the beam reflected by the polygon mirror 164 so that the beam is led to the wiring 154 to be cut on the printed wiring board 1.

Figure 18:
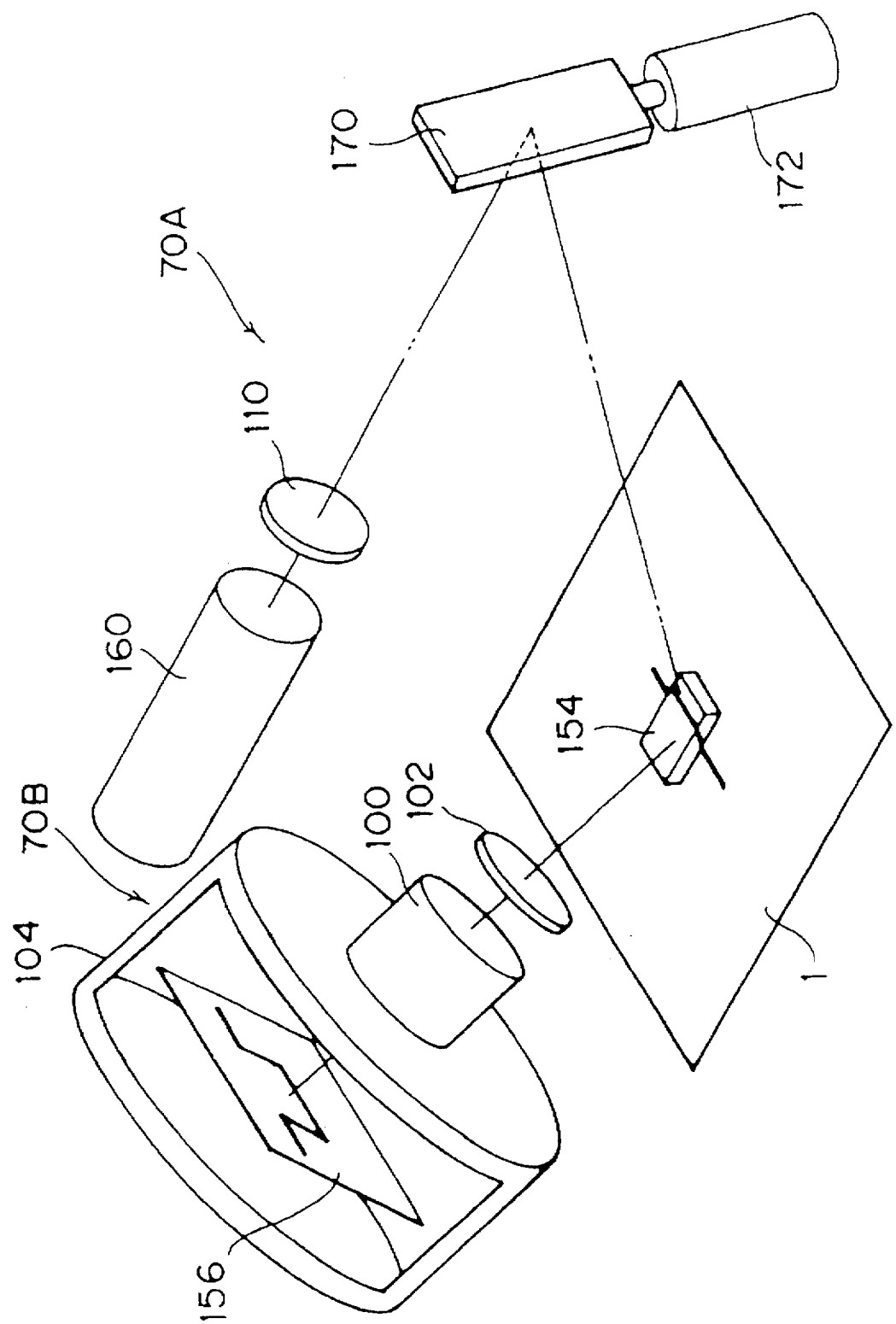
FIG. 18 is a fifth embodiment of the camera unit for optical cutting.

On the other hand, the scanning means in the fifth embodiment of the camera unit for optical cutting shown in FIG. 18 includes a galvano-mirror 170 for reflecting the beam passed through the optical shutter 110 and a drive unit 172 for vibrating the galvano-mirror 170 at a larger amplitude than a predetermined amplitude. The predetermined amplitude here is set so that the length of the obtained probe beam becomes sufficiently larger than the width of the wiring 154 to be cut.

In these embodiments, in order to measure the form parameters (width, thickness, etc.) and the Z coordinate of the wiring to be cut, there is provided a two-dimensional image memory storing the image picked up by the image pickup portion 70B and an angle correction means for adjusting the angle of rotation of the image so that the direction of the thickness of the wiring to be cut is brought into agreement with the y-axis. The y-axis here is one of the orthogonal two axes (x-axis and y-axis) in the two-dimensional image memory.

Figure 19:
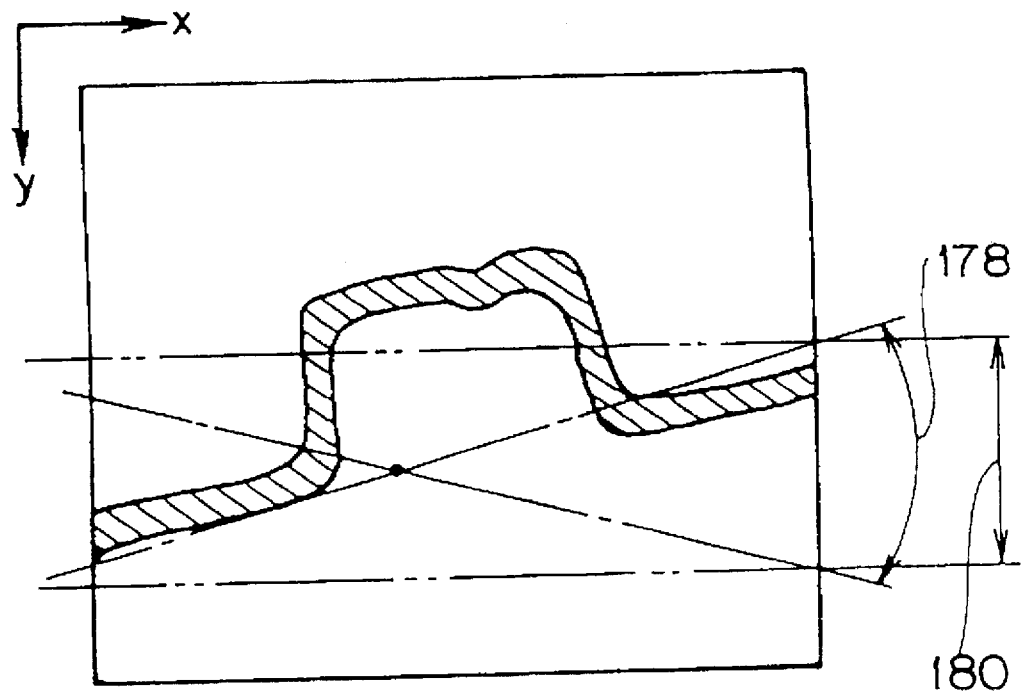
FIG. 19 is a diagram showing an example of stored information in a two-dimensional image memory.

FIG. 19 is a diagram showing an example of stored information in a two-dimensional image memory. The above described correction of angle is achieved by binarizing the stored information in the two-dimensional image memory to "1" corresponding to the image and "0" corresponding to the others, obtaining the frequency of occurrence of "1" in the direction of the y-axis for each angle of rotation of the image, and setting the reference angle so as to be the angle of rotation of the image Giving the maximum value of the frequency of occurrence. Referring to FIG. 19, the curved arrow 178 indicates the range of rotation of the image and the arrow 180 indicates the range of projection. The steps of the angle of rotation of the image is set within the angle of rotation and the distribution of the frequency of occurrence of "1" in the direction of the y-axis is obtained within the range of projection 180.

Figure 20A:
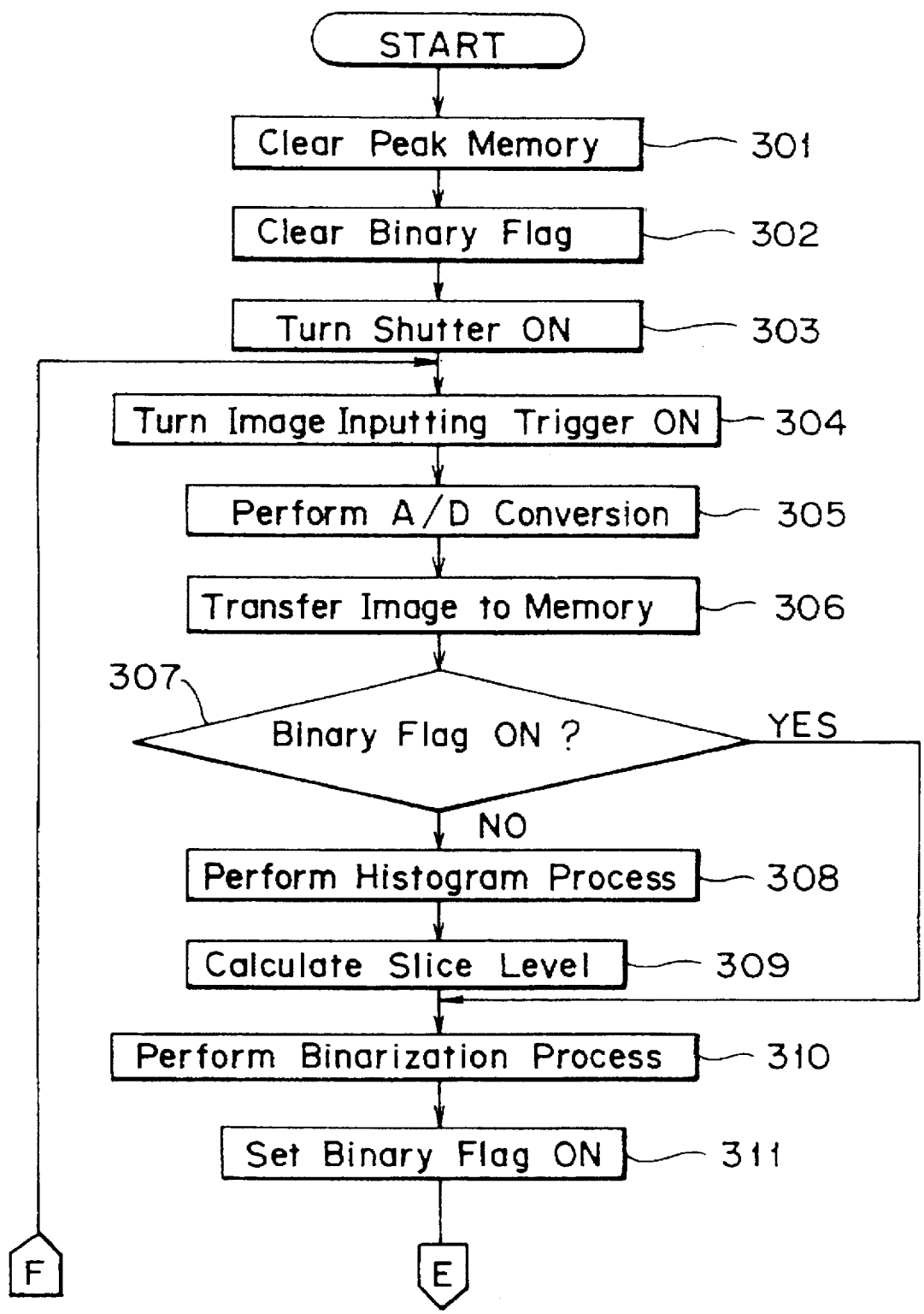
FIGS. 20A and 20B are flowcharts of steps of correction for angle.
Figure 20B:
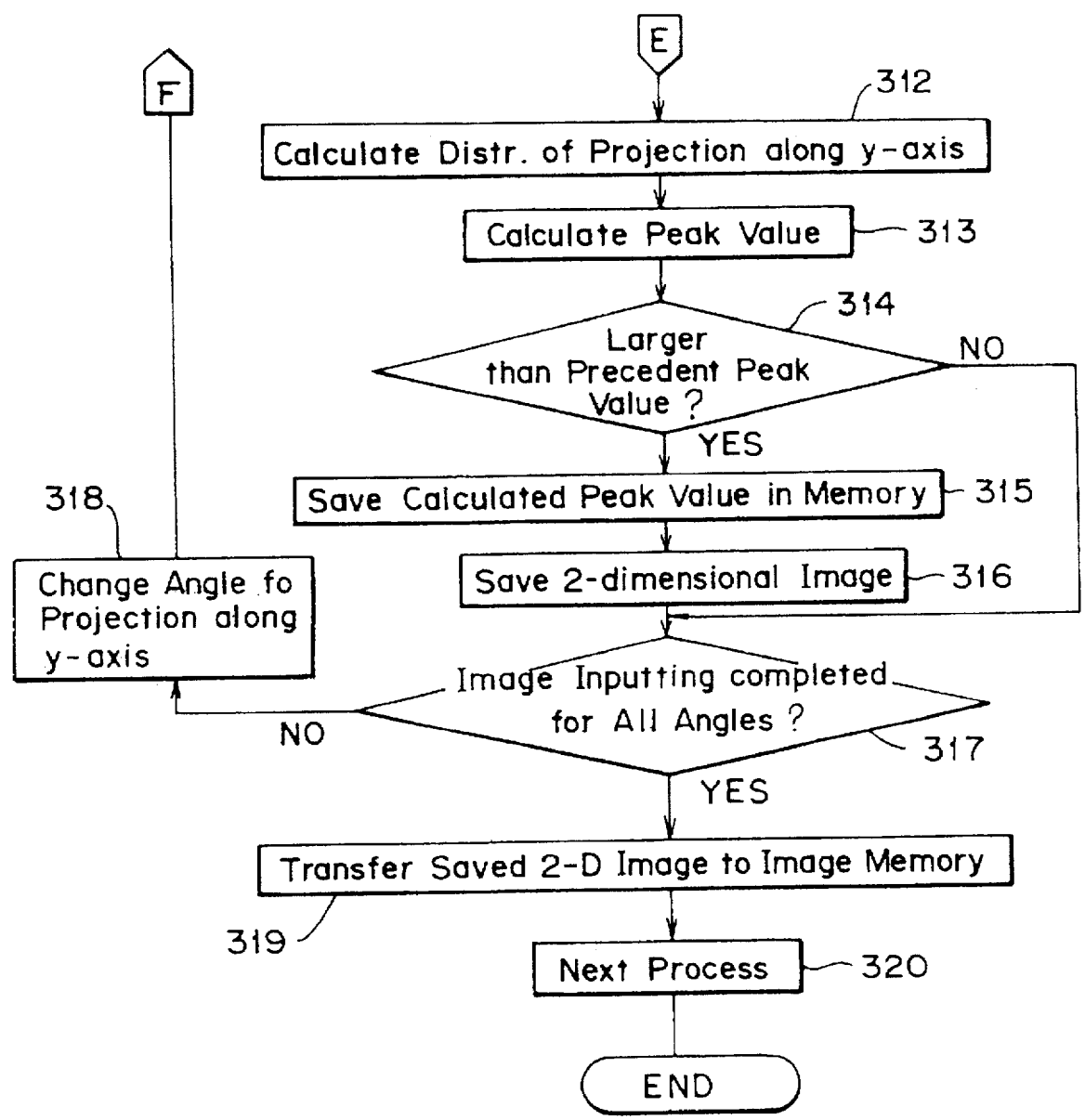
Figure 21A:
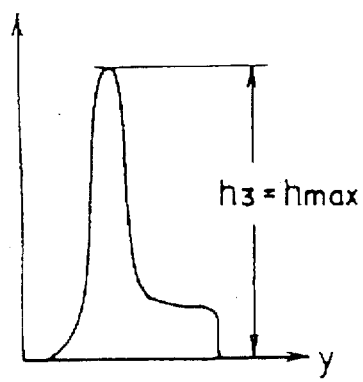
FIGS. 21A, 21B, 21C and 21D are diagrams showing examples of projection of distribution for each step of angle.
Figure 21B:
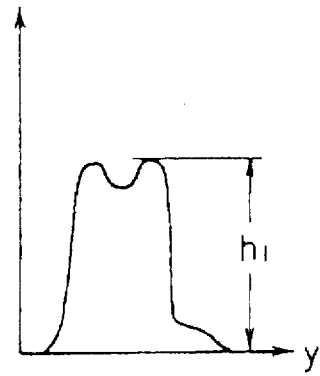
Figure 21C:
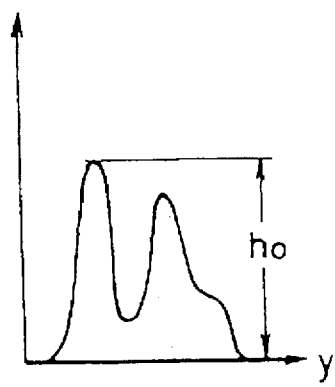
Figure 21D:
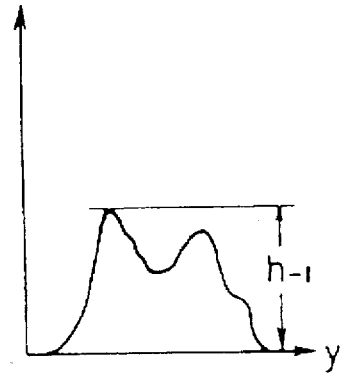

A particular example of the correction of angle will be described below referring to flowcharts of FIG. 20A and FIG. 20B. First, the peak memory is cleared in step 301, a binary flag is cleared in step 302, and the optical shutter 110 is turned on in step 303. Then, the image inputting trigger is turned on in step 304, the input image is analog-to-digital converted in step 305, and it is transferred to the image memory in step 306. In step 307, it is judged whether or not the binary flag is on, and when it is on, the processing jumps to step 310 and therein a binarization process is performed. When the binary flag is off, a histogram process is performed in step 308, the slice level is calculated in step 309, and then the processing is advanced to step 310.

Then, in step 311, the binary flag is set on and, in step 312, the projection of distribution (distribution of the frequency of occurrence of "1") along the y-axis is calculated. In step 313, the peak value (the maximum value of the frequency of occurrence) is calculated. In step 314, it is determined whether or not the peak value is larger than the peak value precedently obtained. When the peak value is smaller than the precedent peak, the processing jumps to step 317. When the peak value is larger than the precedent peak value, the processing is advanced to step 315 and, therein, the peak value is saved in the memory and, then, in step 316, the two-dimensional image is saved. In step 317, it is judged whether or not the inputting of image is completed for all of the steps of angle, and when it is not completed yet, the step of angle is changed in the following step 318 and the processing is returned to step 304. When it is judged that the inputting of image is completed in step 317, the processing is advanced to step 319 and, therein, the saved two-dimensional image is transferred to the image memory. Then, in step 320, next process is performed and this flow is ended.

FIGS. 21A, 21B, 21C and 21D show examples of projection of distribution for each step of angle. The distribution shown in FIG. 21A corresponds to an angle of +3° and this distribution is that obtained at the limit of angle in a counterclockwise direction of the range of rotation in FIG. 19. Distributions shown in FIGS. 21B, 21C and 21D correspond to +1°, 0°, and −1°, respectively. Since the peak value of the frequency of "1" is at its maximum where the angle is +3° shown in FIG. 21A, the angle +3° is set to be the reference angle. The setting of the reference angle is achieved by rotational coordinate transformation in the two-dimensional coordinate memory, changing the inclination of the printed wiring board 1, or rotating the image pickup portion 70B with respect to its optical axis.

Below will be described a method calculating the width and thickness of the wiring to be cut on the basis of the stored information in the two-dimensional coordinate memory which has undergone the correction for angle. The width of the wiring to be cut can be directly obtained from the width in the direction of the x-axis of the stored information corrected for angle. On the other hand, there are several methods to calculate the thickness of the wiring to be cut, which will be described below one by one.

Figure 22:
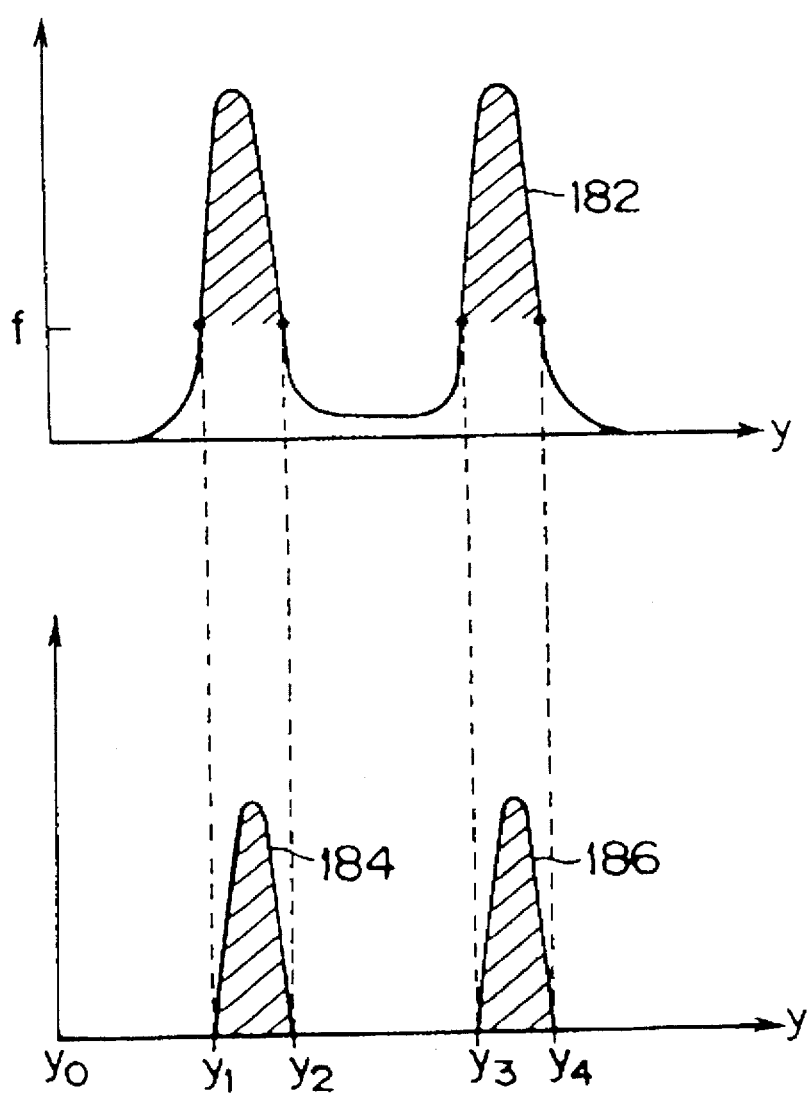
FIG. 22 is a diagram showing a first embodiment for thickness measurement.
Figure 23:
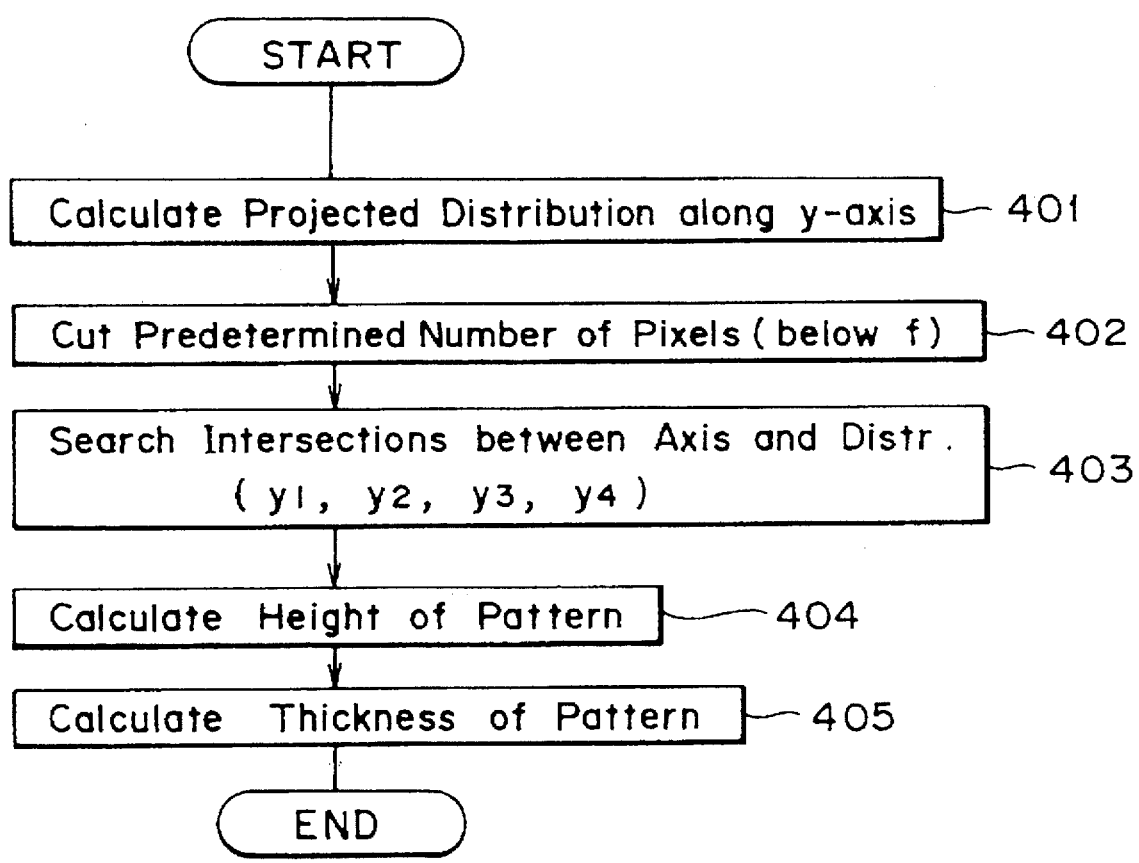
FIG. 23 is a flowchart of steps in the method of measurement shown in FIG. 22.

FIG. 22 is a diagram showing a first embodiment for the measurement of thickness and FIG. 23 is a flowchart of the steps in the method of measurement shown in FIG. 22. First, in step 401, the information stored in the two-dimensional image memory is binarized to "1" corresponding to the image and "0" corresponding to the others and the distribution in the direction of the y-axis of the frequency of occurrence of "1" (projection of distribution along the y-axis) is obtained. The projection of distribution is indicated by reference numeral 182 in FIG. 22. In this embodiment, the correction for angle is already completed. Then, in step 402, a predetermined frequency(f) is subtracted from the obtained projection of distribution and, thereby, a first distribution 184 and a second distribution 186 independent of each other are obtained. Then, in step 403, y-coordinates $y_1$ and $y_2$ of both ends of the first distribution 184 and y-coordinates $y_3$ and $y_4$ of both ends of the second distribution 186 are searched. In step 404, the height (Z coordinate) of the wiring to be cut is calculated according to the following equation using each of the y-coordinates $$Z=(y_3+y_4)/2-y_0$$

where $y_0$ is the reference height. In step 405, the thickness T of the wiring to be cut is calculated according to the following equation using each of the y-coordinates.

$$T=\{(y_3+y_4)-(y_1+y_2)\}/2$$

Figure 24:
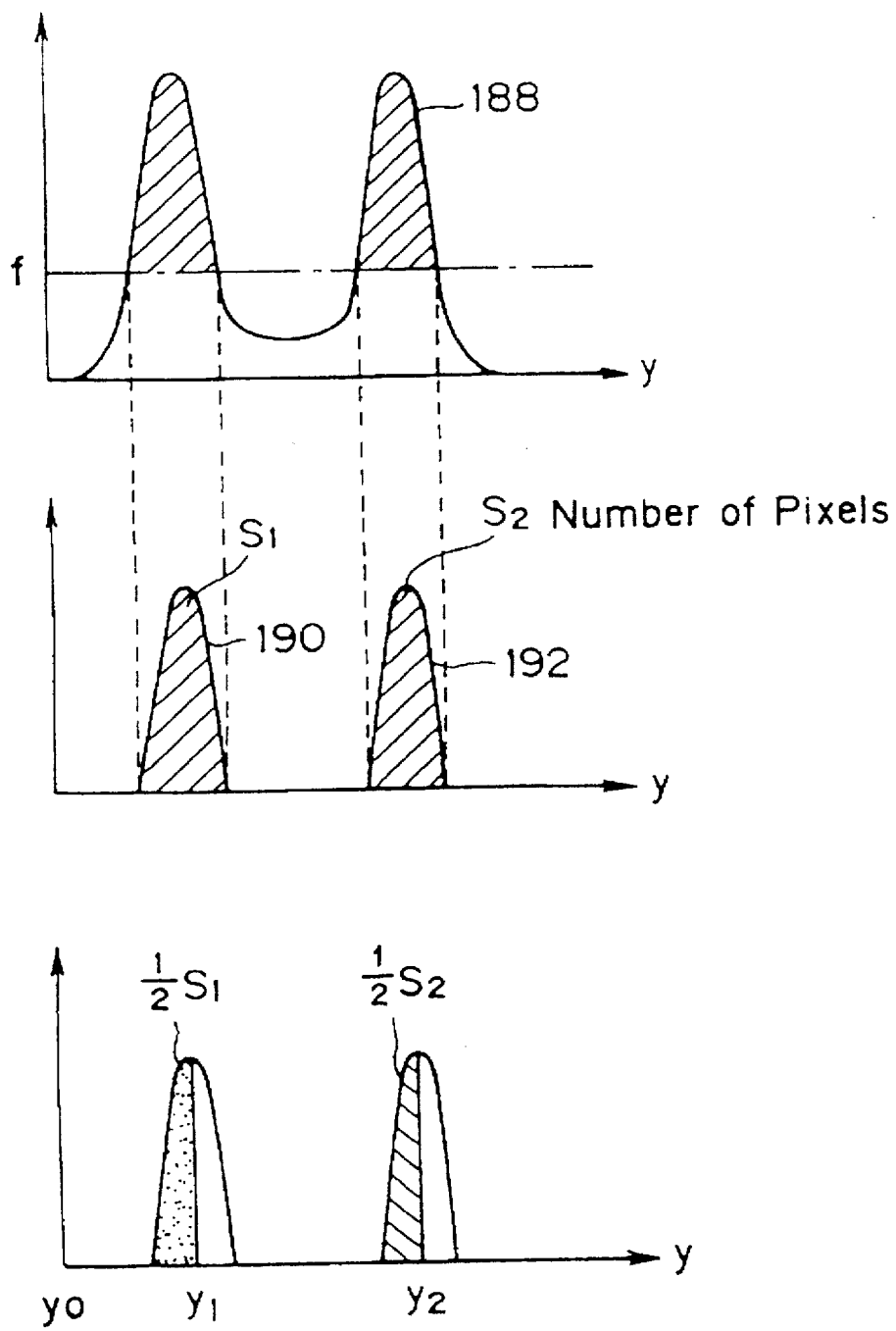
FIG. 24 is a diagram showing a second embodiment for thickness measurement.
Figure 25:
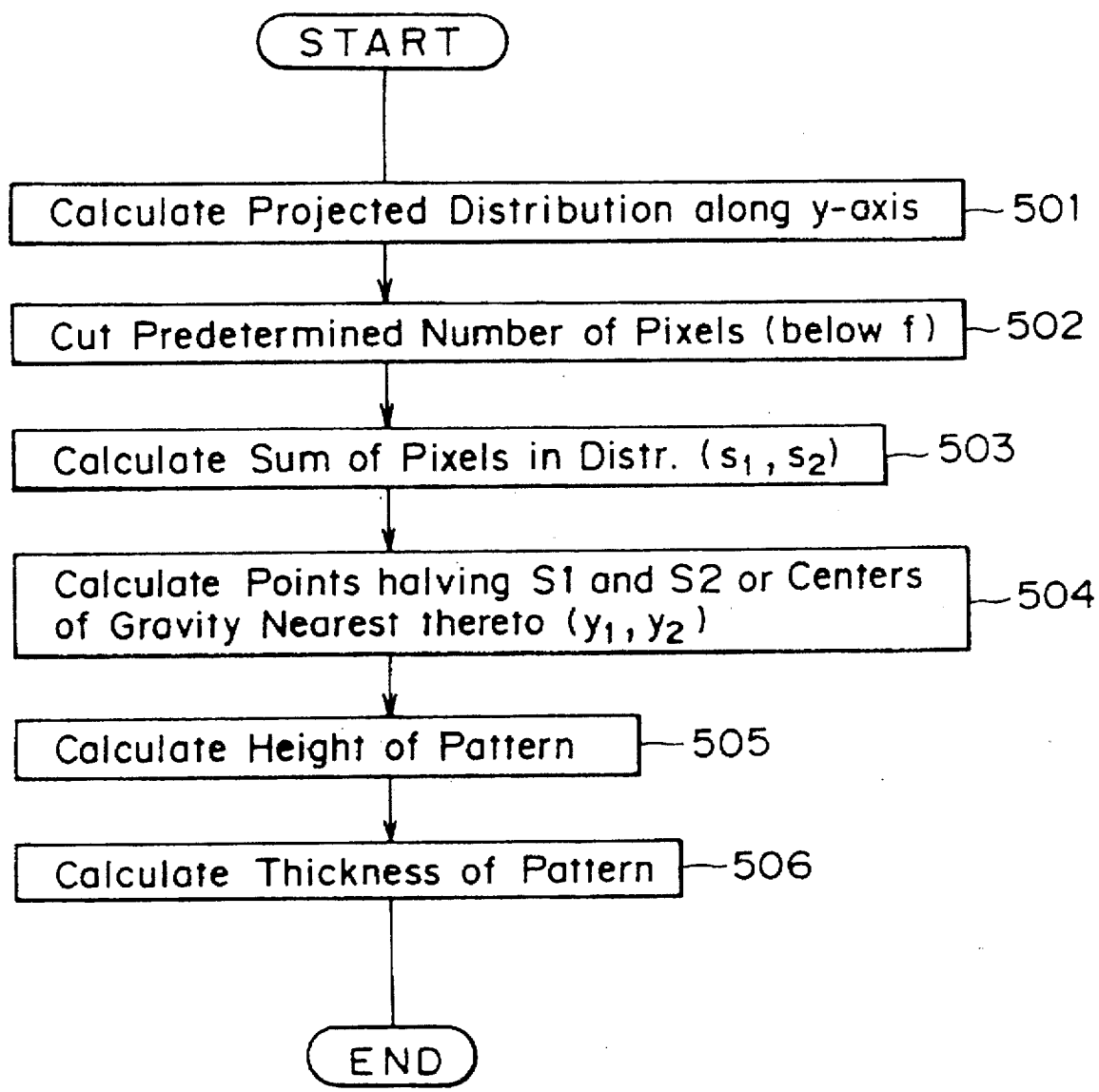
FIG. 25 is a flowchart of steps in the method of measurement shown in FIG. 24.

FIG. 24 is a diagram showing a second embodiment for the measurement of thickness and FIG. 25 is a flowchart of the steps for the measurement of FIG. 24. In step 501, a projection of distribution 188 along the y-axis is obtained. Then, in step 502, a predetermined frequency(f) is subtracted from the obtained projection of distribution and, thereby, a first distribution 190 and a second distribution 192 independent of each other are obtained. In step 503, the area $S_1$ of the first distribution 190 and the area $S_2$ of the second distribution 192 are calculated. In step 504, the y-coordinate y1 at which the area $S_1$ of the first distribution 190 is halved and the y-coordinate $y_2$ at which the area $S_2$ of the second distribution 192 is halved are calculated. In step 505, the height (Z coordinate) of the wiring to be cut is calculated according to the following equation using each of the y-coordinates.

$$Z=y_2-y_0$$

Then, in step 506, the thickness T of the wiring to be cut is calculated according to the following equation using each of the y-coordinates.

$$T=y_2-y_1$$

Figure 27:
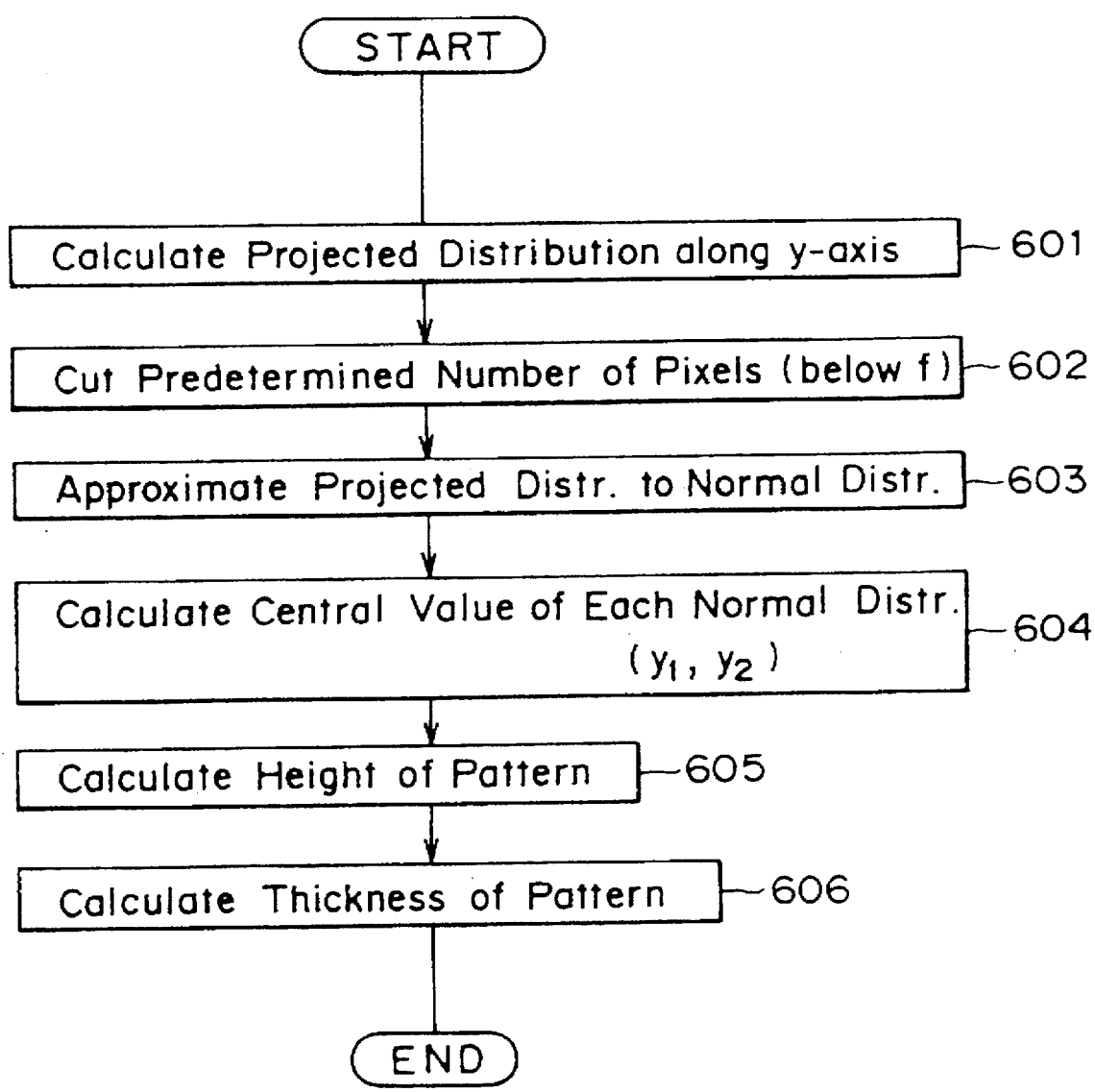
FIG. 27 is a flowchart of steps in the method of measurement shown in FIG. 26.

FIG. 26 is a diagram showing a third embodiment for the measurement of thickness and FIG. 27 is a flowchart of the steps for the measurement of FIG. 26. In step 601, a projection of distribution 194 along the y-axis is obtained. Then, in step 602, a predetermined frequency(f) is subtracted from the obtained projection of dis tribution and, thereby, a first distribution 196 and a second distribution 198 independent of each other are obtained. In step 603, the first distribution 196 is approximated to a normal distribution 242 and the second distribution 198 is approximated to a normal distribution 244. In step 604, an arithmetic mean value y1 of the y-coordinates in the normal distribution 242 is calculated and also an arithmetic mean value $y_2$ of the y-coordinates in the normal distribution 244 is calculated. In step 605, the height (Z coordinate) of the wiring to be cut is calculated according to the following equation using each of the mean values.

$$Z=y_2-y_0$$

In step 606, the thickness T of the wiring to be cut is calculated according to the following equation using each of the mean values.

$$T=y_2-y_1$$

Figure 28:
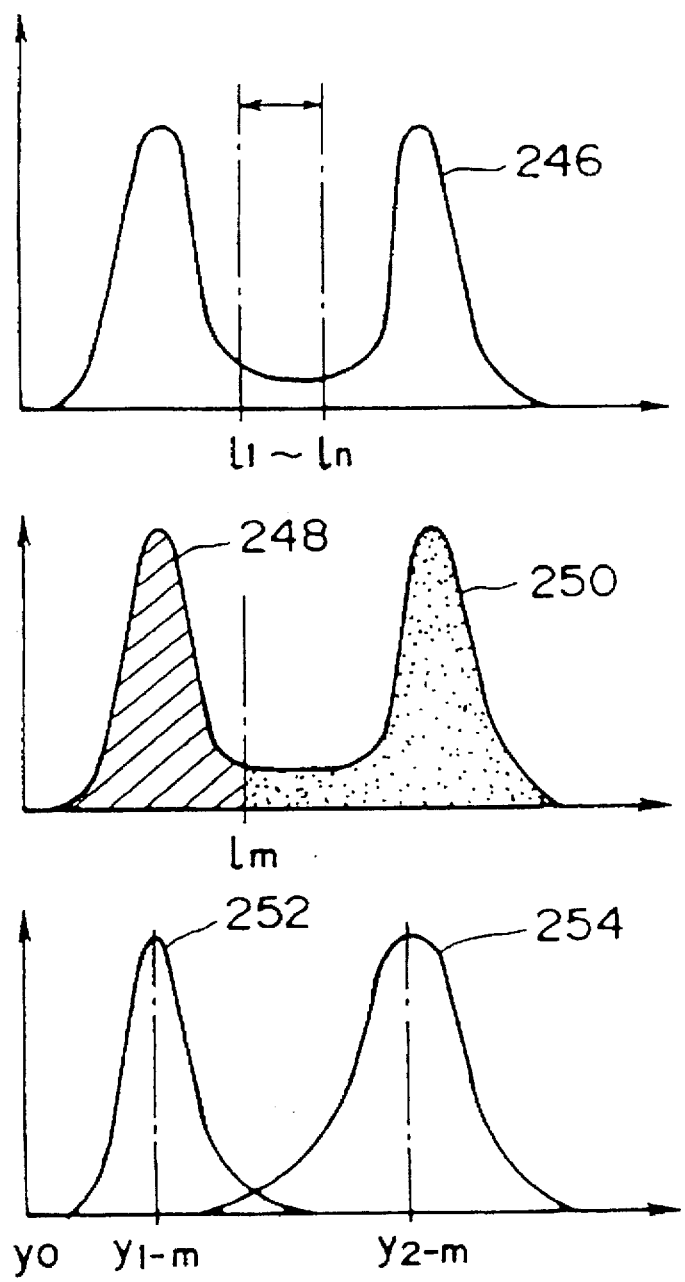
FIG. 28 is a diagram showing a fourth embodiment for thickness measurement.
Figure 29A:
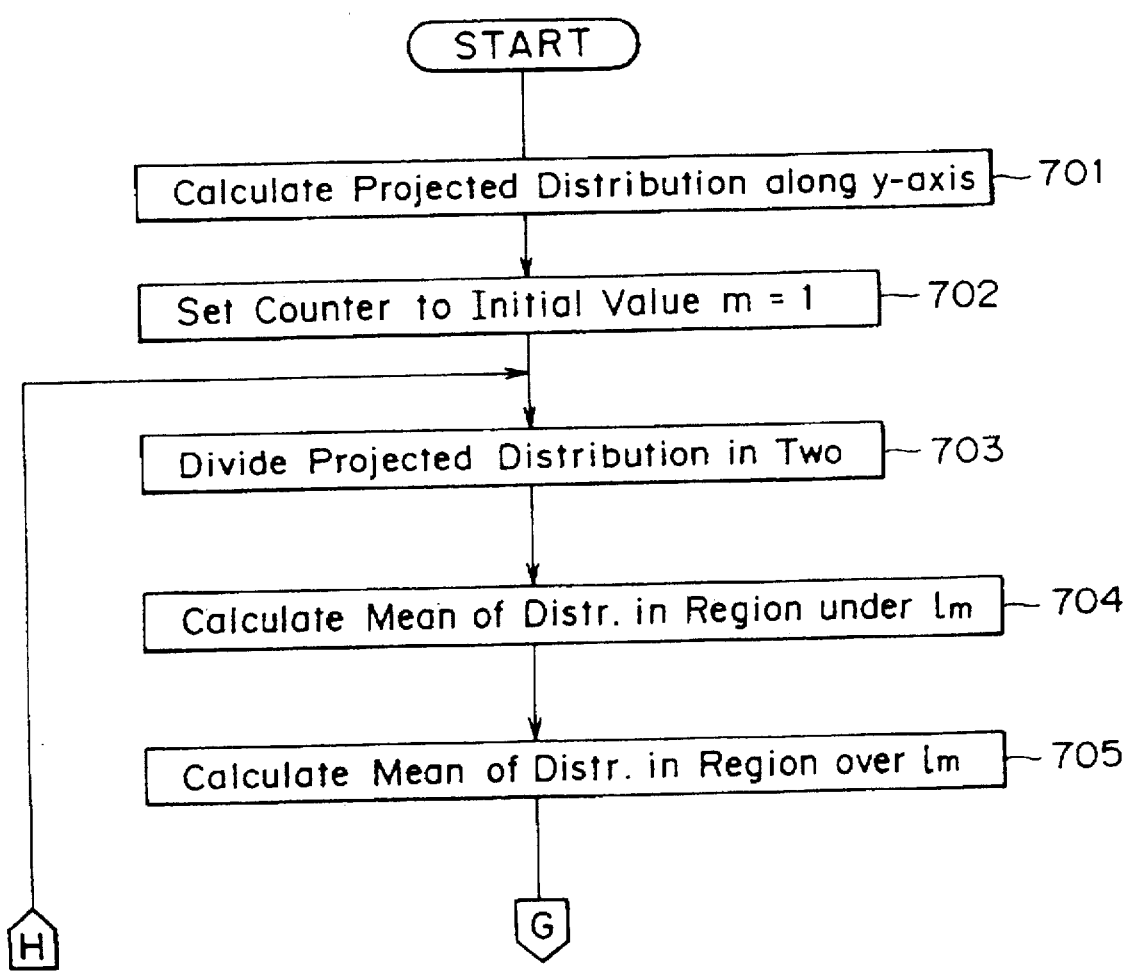
FIGS. 29A and 29B are flowcharts of steps in the method of measurement shown in FIG. 28.
Figure 29B:
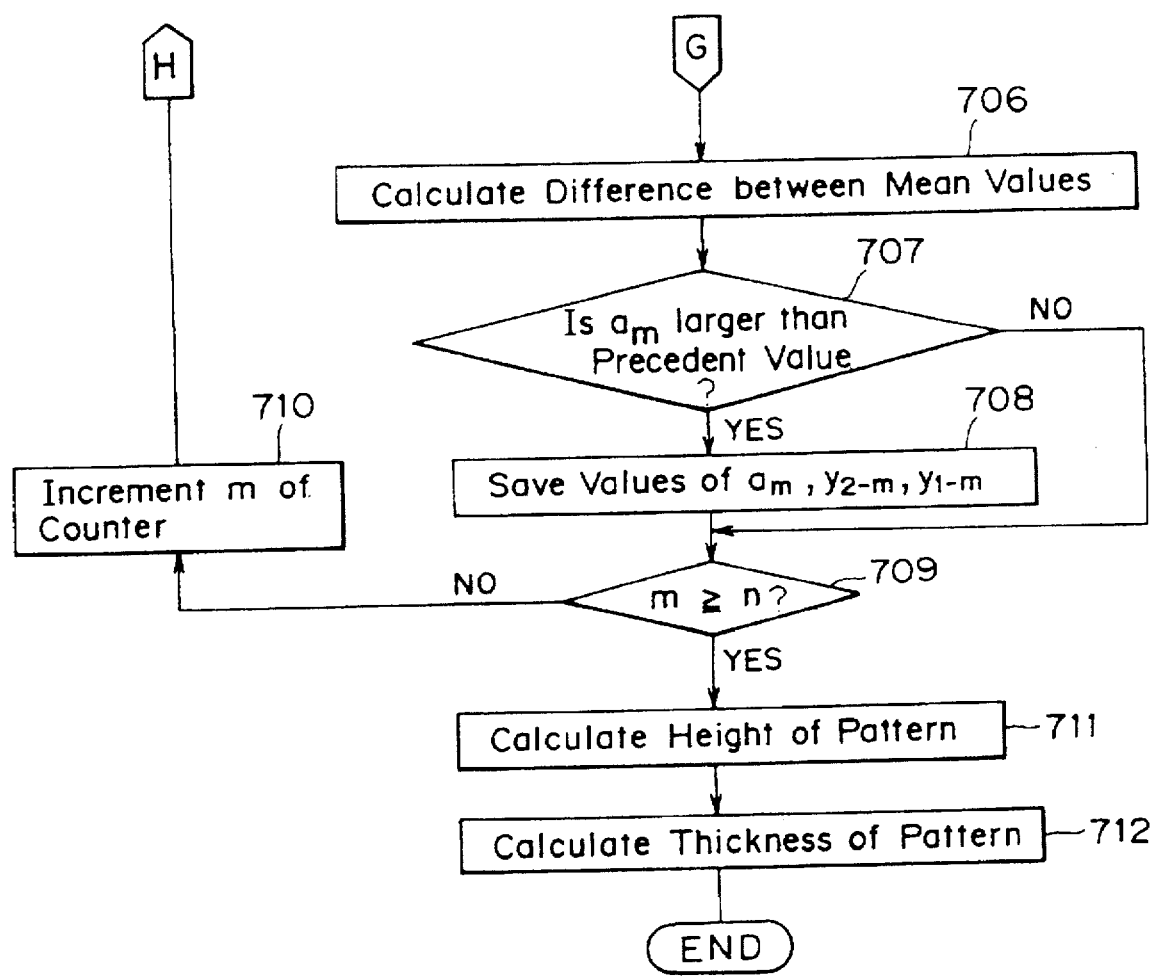

FIG. 28 is a diagram showing a fourth embodiment for the measurement of thickness and FIGS. 29A and 29B are flowcharts of the steps in the method of measurement shown in FIG. 28. In step 701, a projection of distribution 246 along the y-axis is obtained. In step 702, the value of a counter is set to an initial value m=1. Then, in step 703, the obtained distribution is divided in two at an arbitrary y-coordinate $l_m$ so that a first distribution 248 being in the region having smaller y-coordinate values than $l_m$ and a second distribution 250 being in the region having larger y-coordinate values than $l_m$ are obtained, where m is a natural number between 1 and a natural number n. In step 704, the first distribution 248 is approximated to a normal distribution 252 and its arithmetic mean value $y_{1-m}$ is calculated. In step 705, the second distribution 250 is approximated to a normal distribution 254 and its arithmetic mean value $y_{2-m}$ is calculated. In step 706, the difference $a_m$ between the mean values defined by the following equation is calculated.

$$a_m = y_{2-m} - y_{1-m}$$

In step 707, it is judged whether or not the mean value $a_m$ is larger than the precedently obtained value, and when it is larger, the mean values $y_{1-m}$ and $y_{2-m}$ and the difference $a_m$ between the mean values are saved. When the difference $a_m$ between the mean values is judged not to be larger than the precedent value, the processing is directly advanced to step 709. In step 709, it is judged whether or not the value m has become larger than n, and when it has not, the processing is forwarded to step 710, in which the counts m is incremented, and it is returned to step 703. When m is larger than n in step 709, the processing is forwarded to step 711 and the height (Z coordinate) of the wiring to be cut is calculated according to the following equation.

$$Z = y_{2-m} - y_0$$

Then, in step 712, the thickness T of the wiring to be cut is calculated according to the following equation.

$$T = y_{2-m} - y_{1-m}$$

Figure 30:
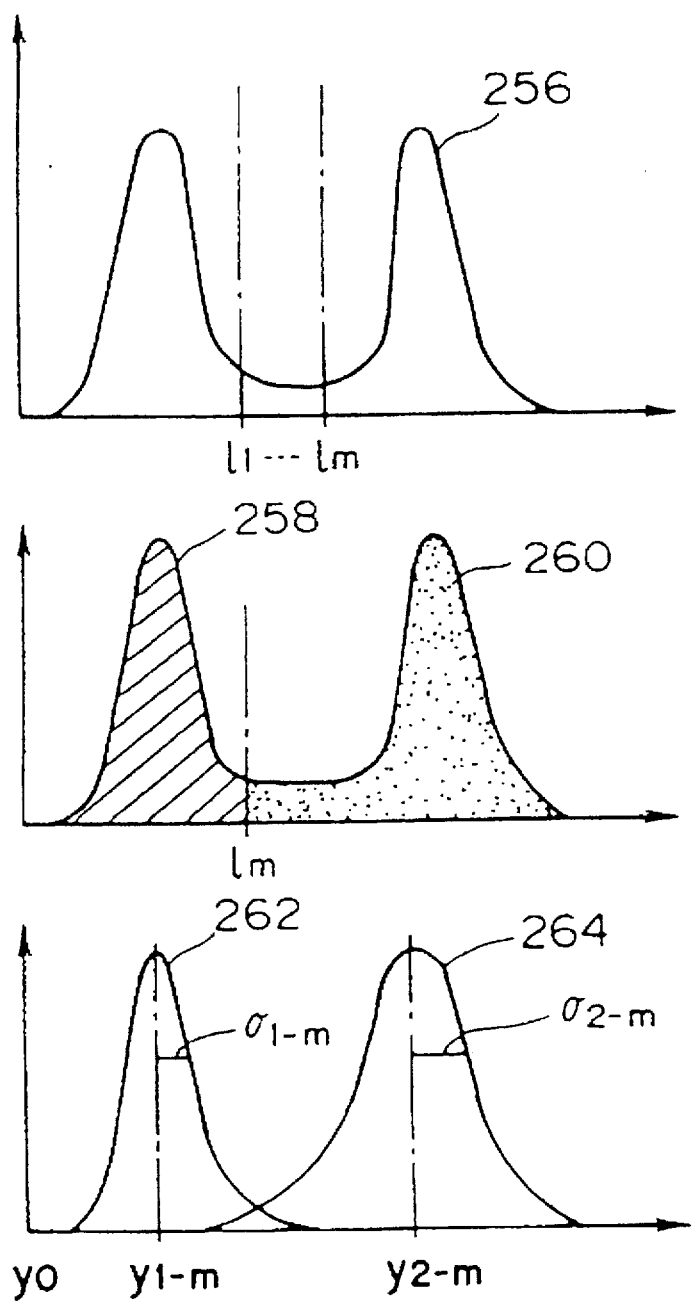
FIG. 30 is a diagram showing a fifth embodiment for thickness measurement.
Figure 31A:
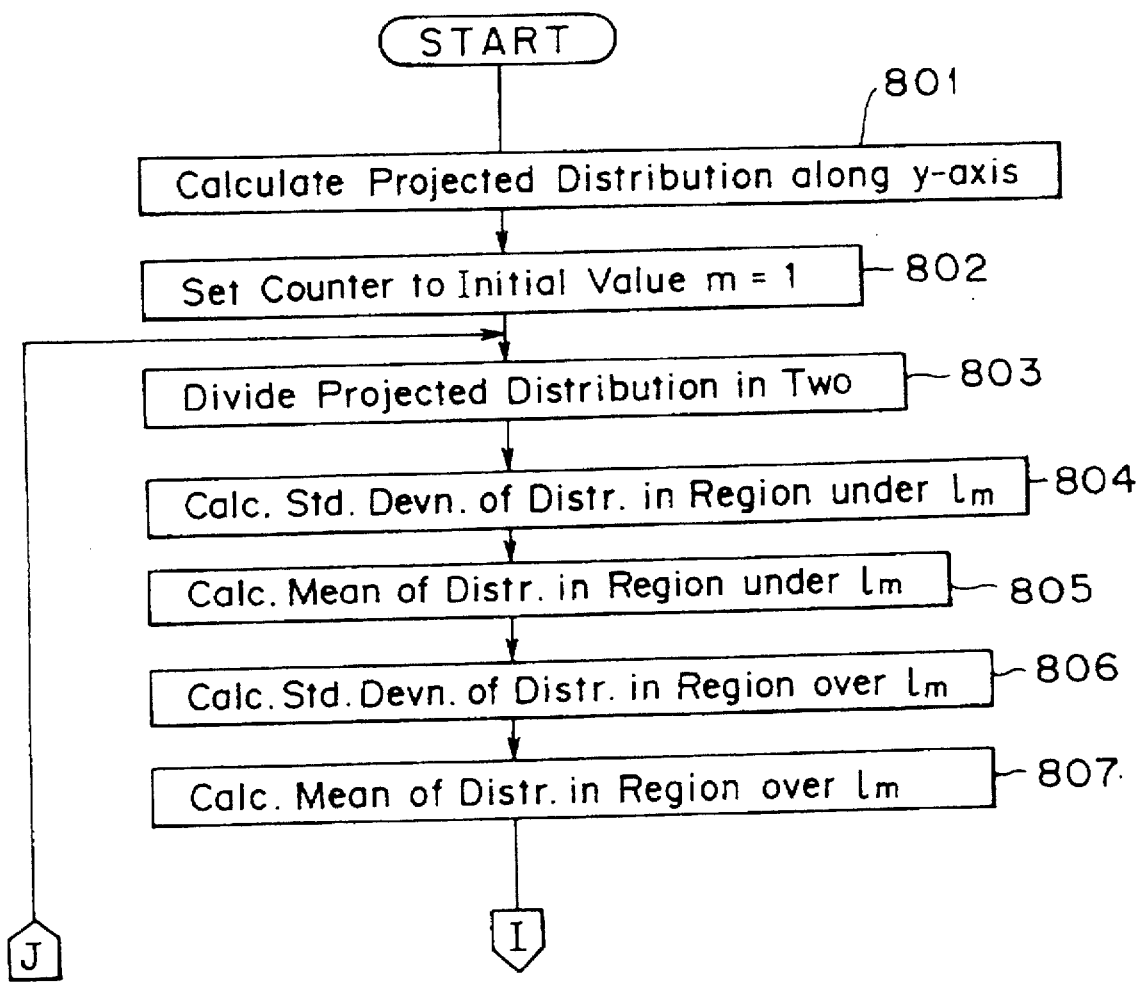
FIGS. 31A and 31B are flowcharts of steps in the method of measurement shown in FIG. 30.
Figure 31B:
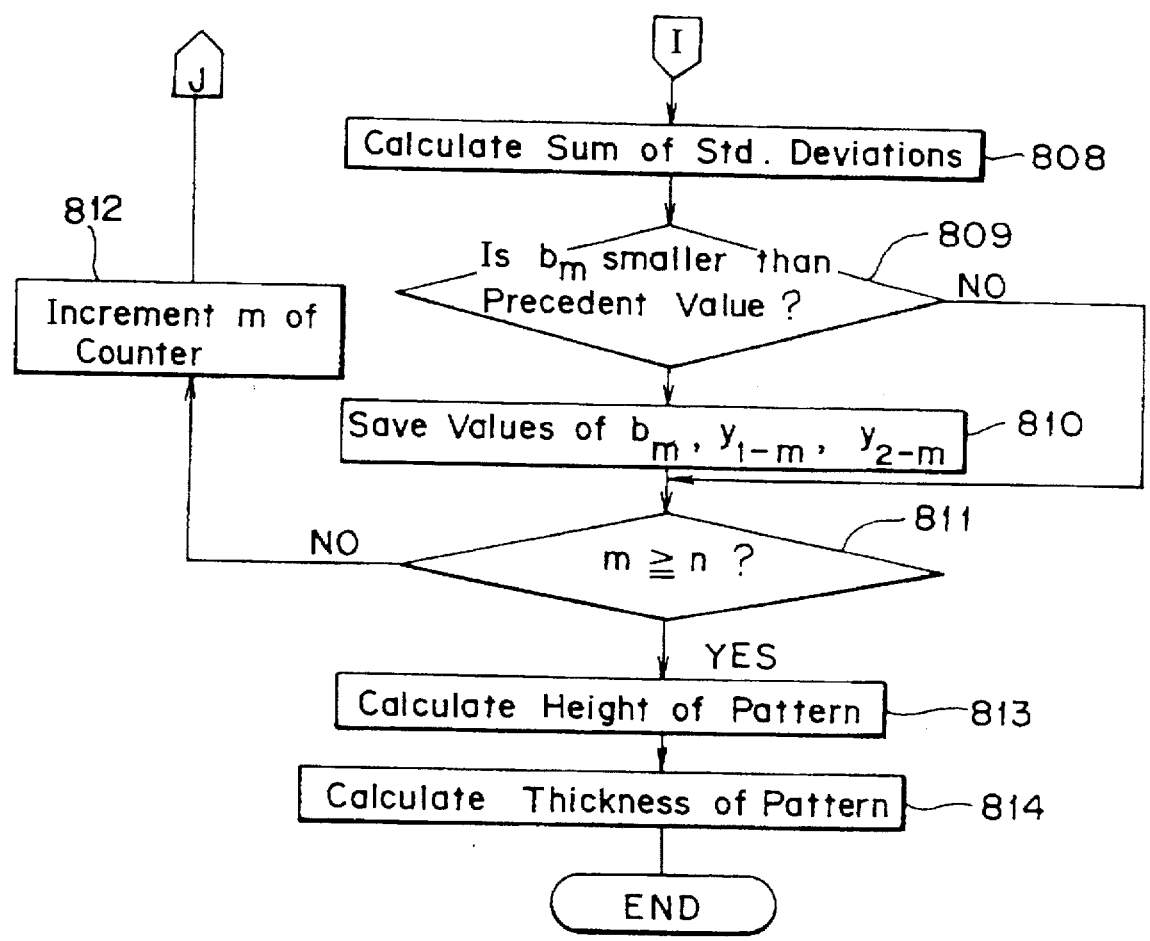

FIG. 30 is a diagram showing a fifth embodiment for the measurement of thickness and FIGS. 31A and 31B are flowcharts of the steps in the method of measurement shown in FIG. 30. In step 801, a projection of distribution 256 along the y-axis is obtained. Then, in step 802, the value of a counter is set to an initial value m =1. Then, in step 803, the obtained distribution is divided in two at an arbitrary y-coordinate $l_m$ so that a first distribution 258 being in the region having smaller y-coordinate values than $l_m$ and a second distribution 260 being in the region having larger y-coordinate values than $l_m$ are obtained. In step 804, the first distribution 258 is approximated to a normal distribution 262 and its standard deviation $\alpha_{1-m}$ is calculated. In step 805, the arithmetic mean value $y_{1-m}$ of the normal distribution 262 is calculated. In step 806, the second distribution 260 is approximated to a normal distribution 264 and its standard deviation $\sigma_{2-m}$ is calculated, and, in step 807, the arithmetic mean value $y_{2-m}$ of the normal distribution 264 is calculated. In step 808, the sum $b_m$ of the standard deviations defined by the following equation is calculated.

$$b_m = \sigma_{1-m} + \sigma_{2-m}$$

Then, in step 809, it is judged whether or not the sum $b_m$ of the standard deviations is smaller than the precedently calculated value, and, when it is smaller, values of the sum $b_m$ of the standard deviations and the standard deviations $y_{1-m}$ and $y_{2-m}$ are saved and, then, the processing is advanced to step 811. When the sum of the standard variations $b_m$ is judged not to be smaller than the precedent value in step 809, the processing is directly advanced to step 811. In step 811, it is judged whether or not the value m is equal to or larger than n, and when m is below n, the processing is forwarded to step 812, in which the value m of the counter is incremented, and the processing is returned to step 803. When it is judged that m is equal to or larger than n in step 811, then the processing is advanced to step 813 and, therein, the height (Z coordinate) of the wiring to be cut is calculated according to the following equation.

$$Z = y_{2-m} - y_0$$

Then, in step 814, the thickness T of the wiring to be cut is calculated according to the following equation.

$$T = y_{2-m} - y_{1-m}$$

Figure 32:
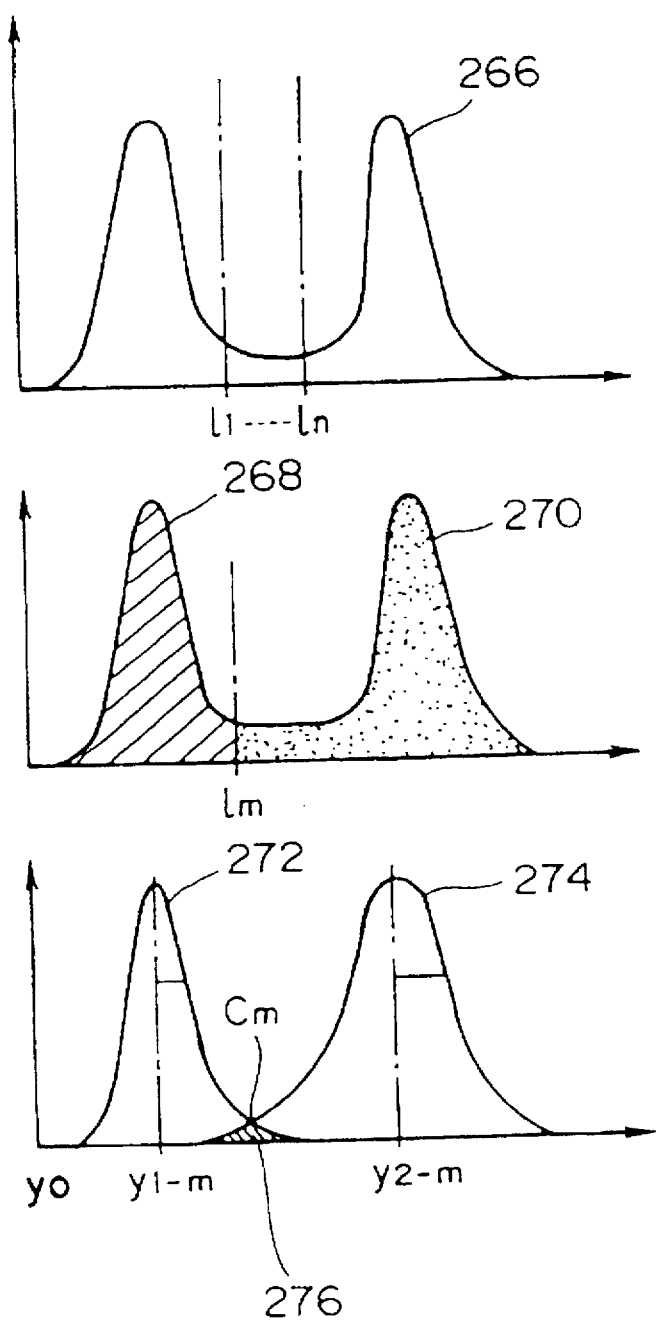
FIG. 32 is a diagram showing a sixth embodiment for thickness measurement.
Figure 33A:
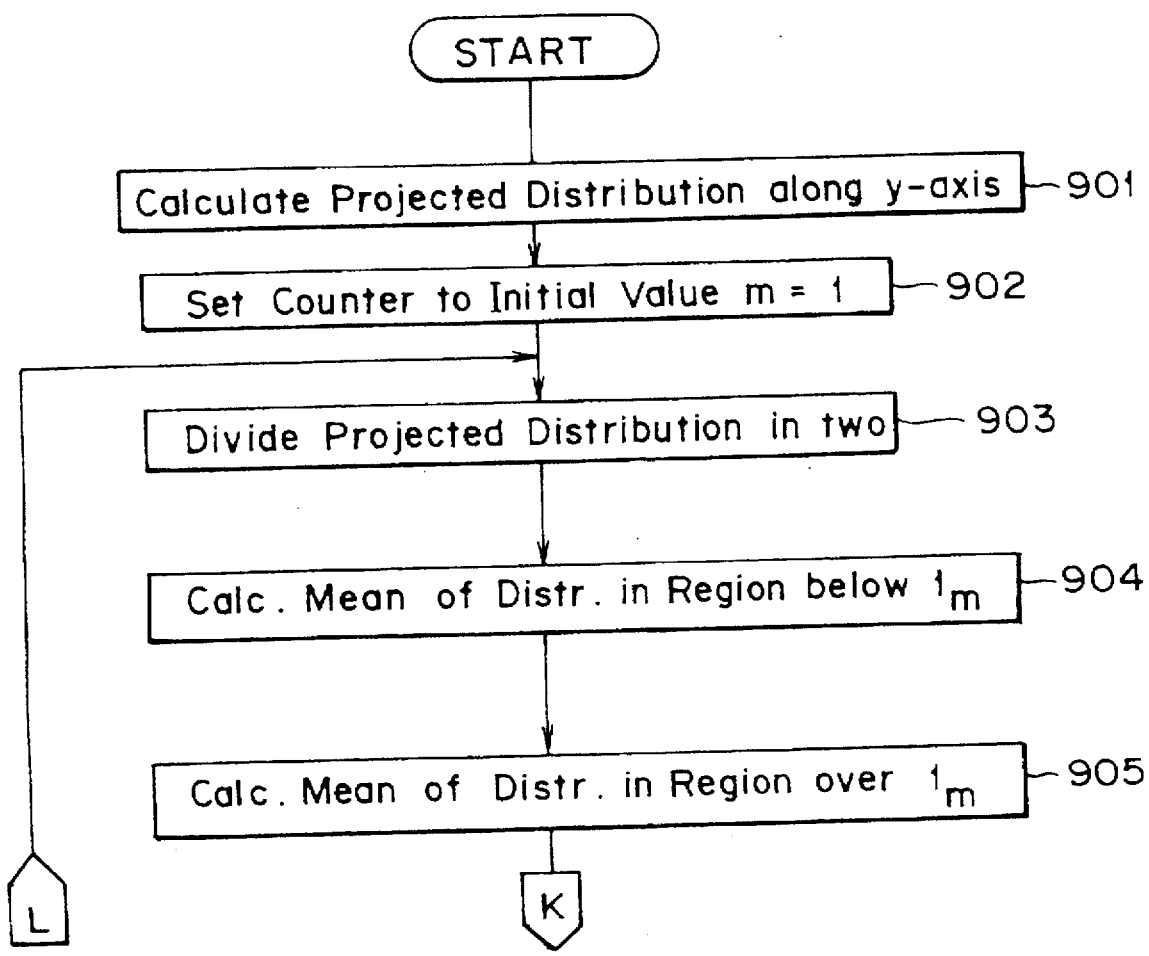
FIGS. 33A and 33B are flowcharts of steps in the method of measurement shown in FIG. 32.
Figure 33B:
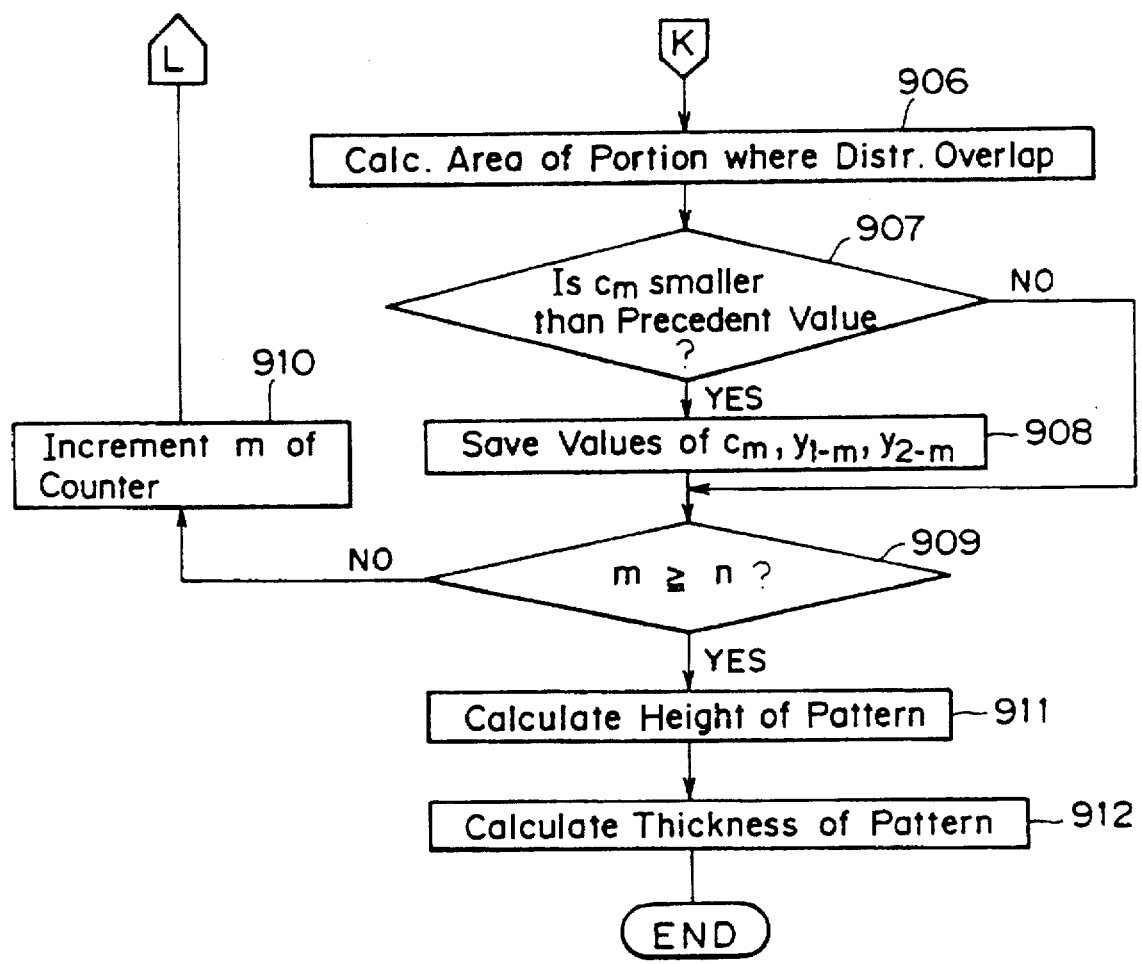

FIG. 32 is a sixth embodiment for the measurement of thickness and FIGS. 33A and 33B are flowcharts of the steps in the method of measurement shown in FIG. 32. In step 901, a projection of distribution 266 along the y-axis is obtained and, then, in step 902, the value of a counter is set to an initial value m=1. Then, in step 903, the obtained distribution is divided in two at an arbitrary y-coordinate $l_m$ so that a first distribution 268 being in the region having smaller y-coordinate values than $l_m$ and a second distribution 270 being in the region having larger y-coordinate values than $l_m$ are obtained. In step 904, the first distribution 268 is approximated to a normal distribution 272 and its arithmetic mean value $y_{1-m}$ is calculated, and, then, in step 905, the second distribution 270 is approximated to a normal distribution 274 and its arithmetic mean value $y_{2-m}$ is calculated. Then, in step 906, the area $C_m$ of the portion where the normal distributions 272 and 274 overlap each other is calculated.

In step 907, it is judged whether or not the area $c_m$ is smaller than the precedently obtained value, and when it is smaller, the processing is advanced to step 908, and, therein, values of the area $c_m$ and the arithmetic mean values $y_{1-m}$ and $y_{2-m}$ are saved and the processing is then advanced to step 909. When the area $c_m$ is judged not to be smaller than the precedent value in step 907, the processing is advanced to step 909. In step 909, it is judged whether or not m is equal to or larger than n, and when m is smaller than n, the processing is advanced to step 910 and, therein, the value m of the counter is incremented, and the processing is returned to step 903. When it is judged that m is equal to or larger than n in step 909, the processing is forwarded to step 911, and, therein, the height (Z coordinate) of the wiring to be cut is calculated according to the following equation.

$$Z = y_{2-m} - y_0$$

Then, in step 912, the thickness T of the wiring to be cut is calculated according to the following equation.

$$T = y_{2-m} - y_{1-m}$$

According to the present embodiments, as described in the foregoing, the form parameter and Z coordinate of a wiring to be cut are arranged to be measured by an optical cutting method. Accordingly, by controlling the beam parameters of the laser beam according to the measured values, favorable cutting of a wiring can be achieved without damaging the insulating layer.

As described above, such an effect is obtained from the present invention that an apparatus for cutting a wiring on a printed wiring board fit for automation can be provided.

While the present invention has been described with reference to particular embodiments, the invention is not limited to the details of these embodiments. Preferred embodiments described herein are given by way of illustration only and not limitative of the present invention. The scope of the invention is defined by the appended claims and all changes and modifications as fall within the equivalence of the scope of the claims are therefore to be embraced by the invention.

What is claimed is:

1. An apparatus for cutting a wiring on a printed wiring board with a laser beam, comprising:
   a laser oscillator emitting said laser beam along a main optical path including a convergent optical system;
   multiaxis positioning means for holding said printed wiring board virtually orthogonal to said main optical path and changing three-dimensional coordinates of said printed wiring board;

X-Y axis adjustment means for adjusting the two-dimensional coordinates, of said three-dimensional coordinates, perpendicular to said main optical path in accordance with position information supplied from a host computer such that said laser beam is directed on to a wiring to be cut;

optical means for optically measuring a size of said wiring to be cut; and control means for controlling beam parameters of said laser beam in accordance with said size measured by said optical means such that said wiring to be cut is cut most suitably; wherein said optical means includes beam projecting means for outputting a slender strip-formed beam for optically cutting said wiring to be cut along its length, and image pickup means for picking up an image of said beam directed on to said wiring to be cut from an angle different from the angle of the beam projection made by said beam projecting means; and said apparatus further comprising a two-dimensional image memory for storing the image picked up by said image pickup means, and thickness calculation means for calculating the thickness of said wiring to be cut according to stored information in said two-dimensional image memory.

2. An apparatus for cutting a wiring according to claim 1, wherein said size measured by said optical means includes a width and a thickness of said wiring to be cut, and said optical means measures said size by a method of optical cutting.

3. An apparatus for cutting a wiring according to claim 2, wherein said control means changes a current value in a power supply to said laser oscillator according to the measured value of the thickness of said wiring to be cut.

4. An apparatus for cutting a wiring according to claim 2, wherein said control means changes the laser oscillation mode in said laser oscillator according to the measured value of the thickness of said wiring to be cut.

5. An apparatus for cutting a wiring according to claim 2, wherein said control means changes the laser pulse width in said laser oscillator according to the measured value of the thickness of said wiring to be cut.

6. An apparatus for cutting a wiring according to claim 2, wherein said laser oscillator intermittently emits said laser beam plural times, and said control means changes the number of times of the emission of said laser beam in said laser oscillator according to the measured value of the thickness of said wiring to be cut.

7. An apparatus for cutting a wiring according to claim 6, further comprising means for checking the state of remainder of said wiring to be cut each time said laser beam is emitted, wherein the emission of said laser beam is stopped when said wiring to be cut has disappeared.

8. An apparatus for cutting a wiring according to claim 2, further comprising a slit with a variable slit width disposed in said main optical path for changing the beam form of said laser beam, wherein said control means changes the slit width of said slit according to the measured value of the thickness of said wiring to be cut.

9. An apparatus for cutting a wiring according to claim 1, wherein said image pickup means includes an optical bandpass filter with a passband including the wavelength of said prove beam disposed in confrontation with said wiring to be cut, a television camera for picking up said image through said optical bandpass filter, and a focusing lens for forming said image on the image pickup plane of said television camera.

10. An apparatus for cutting a wiring according to claim 1, wherein said thickness calculation means includes means for binarizing stored information in said two-dimensional image memory to "1" corresponding to said image and "0" corresponding to the others, means for obtaining a distribution of occurrence frequency of "1" in the direction of said y-axis, means for obtaining a first and a second distribution independent of each other by subtracting a predetermined frequency from the obtained distribution, and means for calculating the thickness T of said wiring to be cut, when y-coordinates of both ends of said first distribution are denoted by $y_1$ and $y_2$ and y-coordinates of both ends of said second distribution are denoted by $y_3$ and $y_4$, according to the following equation:

$$T=\{(y_3+y_4)-(y_1+y_2)\}/2.$$

11. An apparatus for cutting a wiring according to claim 1, wherein said optical means includes plural pairs of said beam projecting means and said image pickup means.

12. An apparatus for cutting a wiring according to claim 1, further comprising angle correction means for adjusting the angle of rotation of said image so that, when two orthogonal axes in said two-dimensional image memory are denoted by x-axis and y-axis, the direction of the thickness of said wiring to be cut in said image coincides with said y-axis.

13. An apparatus for cutting a wiring according to claim 1, wherein said beam projecting means includes a laser beam source, a slit to allow a beam radiated from said laser beam source to pass therethrough, a projecting lens to allow the beam passed through said slit to pass therethrough, and an optical shutter to allow the beam passed through said projecting lens to pass therethrough only for a predetermined period of time.

14. An apparatus for cutting a wiring according to claim 1, wherein said beam projecting means includes a laser beam source, an optical shutter to allow a beam radiated from said laser beam source to pass therethrough only for a predetermined period of time, and a cylindrical lens allowing the beam passed through said optical shutter to pass therethrough, and wherein said cylindrical lens generates said probe beam by expanding the beam passed therethrough only in the direction of the width of said wiring to be cut.

15. An apparatus for cutting a wiring according to claim 1, wherein by said beam projecting means includes a laser beam source, an optical shutter to allow a beam emitted from said laser beam source to pass therethrough only for a predetermined period of time, and scanning means for scanning the progressing direction of the beam passed through said optical shutter, and wherein the beam from said scanning means is directed onto a wiring to be cut as said probe beam.

16. An apparatus for cutting a wiring according to claim 15, wherein said scanning means includes a polygon mirror for reflecting a beam passed through said optical shutter, means for rotating said polygon mirror, and a total reflection mirror for further reflecting the beam reflected by said polygon mirror.

17. An apparatus for cutting a wiring according to claim 15, wherein said scanning means includes a galvano-mirror for reflecting the beam passed through said optical shutter, and means for causing said galvano-mirror to vibrate with a larger amplitude than a predetermined amplitude.

18. An apparatus for cutting a wiring according to claim 1, wherein said thickness calculation means includes means for binarizing stored information in said two-dimensional image memory to "1" corresponding to said image and "0" corresponding to the others, means for obtaining a distribution of occurrence frequency of "1" in the direction of said y-axis, means for obtaining a first and a second distribution independent of each other by subtracting a predetermined frequency from the obtained distribution, and means for calculating the thickness T of said wiring to be cut, when the y-coordinate at which the area of said first distribution is halved is denoted by $y_1$ and the y-coordinate at which the area of said second distribution is halved is denoted by $y_2$, according to the following equation:

$$T = y_2 - y_1.$$

19. An apparatus for cutting a wiring according to claim 1, wherein said thickness calculation means includes means for binarizing stored information in said two-dimensional image memory to "1" corresponding to said image and "0" corresponding to the others, means for obtaining a distribution of occurrence frequency of "1" in the direction of said y-axis, means for obtaining a first and a second distribution independent of each other by subtracting a predetermined frequency from the obtained distribution, and means for calculating the thickness T of said wiring to be cut, when an arithmetic mean value of a normal distribution to which said first distribution is approximated is denoted by $y_1$ and an arithmetic mean value of a normal distribution to which said second distribution is approximated is denoted by $y_2$, according to the following equation:

$$T = y_2 - y_1.$$

20. An apparatus for cutting a wiring according to claim 1, wherein said thickness calculation means includes means for binarizing stored information in said two-dimensional image memory to "1" corresponding to said image and "0" corresponding to the others, means for obtaining a distribution of occurrence frequency of "1" in the direction of said y-axis, means dividing the obtained distribution at an arbitrary y-coordinate $l_m$ for obtaining a first distribution in the region whose y-coordinate is smaller than $l_m$ and a second distribution in the region whose y-coordinate is larger than $l_m$, means for calculating an arithmetic mean value $y_{1-m}$ of a normal distribution to which said first distribution is approximated, means for calculating an arithmetic mean value $y_{2-m}$ of a normal distribution to which said second distribution is approximated, means for calculating an area $C_m$ of a portion at which said first and second normal distributions overlap, and means for calculating the thickness T of said wiring to be cut, when said mean values $y_{1-m}$ and $y_{2-m}$ whereby said area $C_m$ is minimized are denoted by $y_1$ and $y_2$, respectively, according to the following equation:

$$T = y_2 - y_1.$$

21. An apparatus for cutting a wiring according to claim 1, wherein said thickness calculation means includes means for binarizing stored information in said two-dimensional image memory to "1" corresponding to said image and "0" corresponding to the others, means for obtaining a distribution of occurrence frequency of "1" in the direction of said y-axis, means dividing the obtained distribution at an arbitrary y-coordinate $l_m$ for obtaining a first distribution in the region whose y-coordinate is smaller than $l_m$ and a second distribution in the region whose y-coordinate is larger than $l_m$, means for calculating an arithmetic mean value $y_{1-m}$ of a normal distribution to which said first distribution is approximated, means for calculating an arithmetic mean value $y_{2-m}$ of a normal distribution to which said second distribution is approximated, means for calculating the difference between the mean values defined by $a_m = y_{2-m} - y_{1-m}$, and means for calculating the thickness T of said wiring to be cut, when said mean values $y_{1-m}$ and $y_{2-m}$ whereby said difference $a_m$ between the mean values is maximized are denoted by $y_1$ and $y_2$, respectively, according to the following equation $$T = y_2 - y_1.$$

22. An apparatus for cutting a wiring according to claim 1, wherein said thickness calculation means includes means for binarizing stored information in said two-dimensional image memory to "1" corresponding to said image and "0" corresponding to the others, means for obtaining a distribution of occurrence frequency of "1" in the direction of said y-axis, means dividing the obtained distribution at an arbitrary y-coordinate $l_m$ for obtaining a first distribution in the region whose y-coordinate is smaller than $l_m$ and a second distribution in the region whose y-coordinate is larger than $l_m$, means for calculating an arithmetic mean value $y_{1-m}$ and a standard deviation $\sigma_{1-m}$ of a normal distribution to which said first distribution is approximated, means for calculating an arithmetic mean value $y_{2-m}$ and a standard deviation $\sigma_{2-m}$ of a normal distribution to which said second distribution is approximated, means for calculating the sum of the standard deviations defined by $b_m = \sigma_{1-m} + \sigma_{2-m}$.

means for calculating the thickness T of said wiring to be cut, when said mean values $y_{1-m}$ and $y_{2-m}$ whereby said sum $b_m$ of the standard deviations is minimized are denoted by $y_1$ and $y_2$, respectively, according to the following equation:

$$T = y_2 - y_1.$$

23. An apparatus for cutting a wiring according to claim 1, wherein said printed wiring board has a mark in a predetermined form provided in a predetermined position, and said apparatus for cutting a wiring further comprises means for identifying said mark, and correction means for correcting said two-dimensional coordinates adjusted by said x-y axis adjustment means, according to said identified mark.

24. An apparatus for cutting a wiring according to claim 23, wherein said correction means includes a first and a second half mirror disposed in said main optical path, a beam source for irradiating said wiring to be cut through said first half mirror, and image pickup means for obtaining an image of said wiring to be cut through said second half mirror.

25. An apparatus for cutting a wiring according to claim 1, further comprising a revolver disposed along said main optical path, and a plurality of lenses having different magnifications supported on said revolver, wherein said laser beam is directed on the said wiring to be cut through a lens selected according to the size of said wiring to be cut.

26. An apparatus for cutting a wiring according to claim 1, wherein said optical means further measures an one-dimensional coordinate along said main optical path of the wiring to be cut, and said apparatus for cutting a wiring further comprises Z axis adjustment means for adjusting the one-dimensional coordinate of said wiring to be cut so that said wiring to be cut is brought to the focal point of said laser beam.

27. An apparatus for cutting a wiring on a printed wiring board with a laser beam, comprising:

a laser oscillator emitting said laser beam along a main optical path including a convergent optical system;

multiaxis positioning means for holding said printed wiring board virtually orthogonal to said main optical path and changing three-dimensional coordinates of said printed wiring board;

X-Y axis adjustment means for adjusting the two-dimensional coordinates, of said three-dimensional coordinates, perpendicular to said main optical path in accordance with position information supplied from a host computer such that said laser beam is directed on to a wiring to be cut;

optical means for optically measuring a size of said wiring to be cut; and control means for controlling beam parameters of said laser beam in accordance with said size measured by said optical means such that said wiring to be cut is cut most suitably;

wherein said optical means measures a width and a thickness of said wiring to be cut, and said optical means measures said size by a method of optical cutting, said optical means including beam projecting means for outputting a slender strip-formed prove beam for optically cutting said wiring to be cut along its length, and image pickup means for picking up an image of said probe beam directed in to said wiring to be cut from an angle different from the angle of the beam projection made by said beam projecting means, said image pickup means having an optical bandpass filter with a passband including the wavelength of said prove beam disposed in confrontation with said wiring to be cut, a television camera for picking up said image through said optical bandpass filter, a focusing lens for forming said image on the image pickup plane of said television camera, and a cylindrical lens disposed between said optical bandpass filter and said focusing lens for expanding the component of said image in the direction of the thickness of said wiring to be cut.

28. An apparatus for cutting a wiring according to claim 10, further comprising a two-dimensional image memory for storing said image picked up by said image pick up means, and width calculation means and thickness calculation means for calculating the width and thickness of said wiring to be cut, respectively, according to stored information in said two-dimensional image memory.

29. An apparatus for cutting a waking according to claim 27, wherein said optical means includes beam projecting means for outputting a slender strip-formed beam for optically cutting said wiring to be cut along its length, and image pickup means for picking up an image of said beam directed on to said wiring to be cut from an angle different from the angle of the beam projection made by said beam projecting means; and said apparatus further comprising a two-dimensional image memory for storing the image picked up by said image pickup means, and thickness calculation means for calculating the thickness of said wiring to be cut according to stored information in said two-dimensional image memory.

30. An apparatus for cutting a wiring on a printed wiring board with a laser beam, comprising:

a laser oscillator emitting said laser beam along a main optical path including a convergent optical system;

multiaxis positioning means for holding said printed wiring board virtually orthogonal to said main optical path and changing three-dimensional coordinates of said printed wiring board;

X-y axis adjustment means for adjusting the two-dimensional coordinates, of said three-dimensional coordinates, perpendicular to said main optical path in accordance with position information supplied from a host computer such that said laser beam is directed on to a wiring to be cut;

optical means for optically measuring a size, including a width and a thickness, of said wiring to be cut by a method of optical cutting, said optical means including beam projecting means for outputting a slender strip-formed prove beam for optically cutting said wiring to be cut along its length, and image pickup means for picking up an image of said probe beam directed in to said wiring to be cut from an angle different from the angle of the beam protection made by said beam projecting means;

control means for controlling beam parameters of said laser beam in accordance with said size measured by said optical means such that said wiring to be cut is cut most suitably;

a two-dimensional image memory for storing said image picked up by said image pickup means; and angle correction means for adjusting the angle of rotation of said image so that, when two orthogonal axes in said two-dimensional image memory are denoted by x-axis and y-axis, the direction of the thickness of said wiring to be cut in said image coincides with said y-axis, including means for binarizing stored information in said two-dimensional image memory to "1" corresponding to said image and "0" corresponding to the others, means for obtaining a distribution of occurrences frequency of "1" in the direction of said y-axis for each step of the angle of rotation of said image, and means for setting a reference angle which is the angle of rotation of said image providing a maximum value of said occurrence frequency.

31. An apparatus for cutting a wiring according to claim 30, wherein the setting of said reference angle is achieved by rotational coordinate transformation in said two-dimensional image memory.

32. An apparatus for cutting a wiring according to claim 30, wherein the setting of said reference angle is achieved by changing the angle of inclination of said printed wiring board.

33. An apparatus for cutting a wiring according to claim 30, wherein the setting of said reference angle is achieved by rotating said image pickup means with respect to its optical axis.

34. An apparatus for cutting a wiring on a printed wiring board with a laser beam, comprising:

a laser oscillator emitting said laser beam along a main optical path including a convergent optical system;

multiaxis positioning means for holding said printed wiring board virtually orthogonal to said main optical path and changing three-dimensional coordinates of said printed wiring board;

X-Y axis adjustment means for adjusting the two-dimensional coordinates, of said three-dimensional coordinates, perpendicular to said main optical path in accordance with position information supplied from a host computer such that said laser beam is directed on to a wiring to be cut;

optical means for optically measuring a size of said wiring to be cut;

control means for controlling beam parameters of said laser beam in accordance with said size measured by said optical means such that said wiring to be cut is cut most suitably;

means for identifying a mark in a predetermined form provided in a predetermined position on said printed wiring board, correction means for correcting said two-dimensional coordinates adjusted by said X-Y axis adjustment means, according to said identified mark, including a first and a second half mirror disposed in said main optical path, a beam source for irradiating said wiring to be cut through said first half mirror, and image pickup means for obtaining an image of said wiring to be cut through said second half mirror;

wherein the state of remainder of said wiring to be cut after said laser beam is emitted from said laser oscillator is further checked according to said image obtained by said image pickup means.

35. An apparatus for cutting a wiring according to claim 34, wherein said optical means includes beam projecting means for outputting a slender strip-formed prove beam for optically cutting said wiring to be cut along its length, and image pickup means for picking up an image of said probe beam directed on to said wiring to be cut from an angle different from the angle of the beam projection made by said beam projecting means.

36. An apparatus for cutting a wiring according to claim 34, wherein said laser oscillator further emits a relatively weak laser beam when the wiring to be cut remains.

* * * * *